(12) United States Patent
Jang et al.

(10) Patent No.: US 9,082,647 B2
(45) Date of Patent: Jul. 14, 2015

(54) SEMICONDUCTOR DEVICES

(71) Applicant: Samsung Electronics Co., Ltd., Suwon-si, Gyeonggi-do (KR)

(72) Inventors: Sung-Ho Jang, Seoul (KR); Dong-Jin Lee, Seoul (KR); Bong-Soo Kim, Yongin-si (KR); Jun-Hee Lim, Seoul (KR); Joon Han, Hwaseong-si (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 14/465,982

(22) Filed: Aug. 22, 2014

(65) Prior Publication Data

US 2015/0123238 A1    May 7, 2015

(30) Foreign Application Priority Data

Nov. 4, 2013    (KR) .......................... 10-2013-0133055

(51) Int. Cl.
  *H01L 27/108*    (2006.01)
  *H01L 27/12*    (2006.01)
  *H01L 27/13*    (2006.01)

(52) U.S. Cl.
  CPC ........ *H01L 27/108* (2013.01); *H01L 27/10844* (2013.01); *H01L 27/10864* (2013.01); *H01L 27/12* (2013.01); *H01L 27/13* (2013.01)

(58) Field of Classification Search
  None
  See application file for complete search history.

(56) References Cited

U.S. PATENT DOCUMENTS

| 8,507,999 | B2 | 8/2013 | Jang et al. |
| 2009/0200612 | A1 | 8/2009 | Koldiaev |
| 2011/0309435 | A1 | 12/2011 | Hwang et al. |
| 2012/0281490 | A1 | 11/2012 | Cho |
| 2013/0005129 | A1 | 1/2013 | Kanakasabapathy et al. |
| 2013/0056823 | A1 | 3/2013 | Kim et al. |
| 2013/0221417 | A1* | 8/2013 | Lee et al. ...................... 257/295 |

FOREIGN PATENT DOCUMENTS

| KR | 1020100013948 A | 2/2010 |
| KR | 1020100037975 A | 4/2010 |
| KR | 1020110137094 A | 12/2011 |
| KR | 1020120003311 A | 1/2012 |

* cited by examiner

*Primary Examiner* — Ha Tran T Nguyen
*Assistant Examiner* — Tyler Drye
(74) *Attorney, Agent, or Firm* — Myers Bigel Sibley & Sajovec, P.A.

(57) ABSTRACT

There is provided a semiconductor device. The semiconductor device may include multiple contacts plugs, an insulation layer pattern, a metal oxide layer pattern, a metal pattern and a metal line. The contact plugs contact a substrate. The insulation layer pattern is formed between the contact plugs and has a top surface lower than those of the contact plugs. The metal oxide layer pattern is formed on the insulation layer pattern, and has a dielectric constant higher than that of silicon oxide. The metal pattern is formed on the metal oxide layer pattern and contacts sidewalls of the contact plugs. The metal line contacts top surfaces of the contact plugs and the metal pattern and extends thereon.

20 Claims, 29 Drawing Sheets

FIG. 14
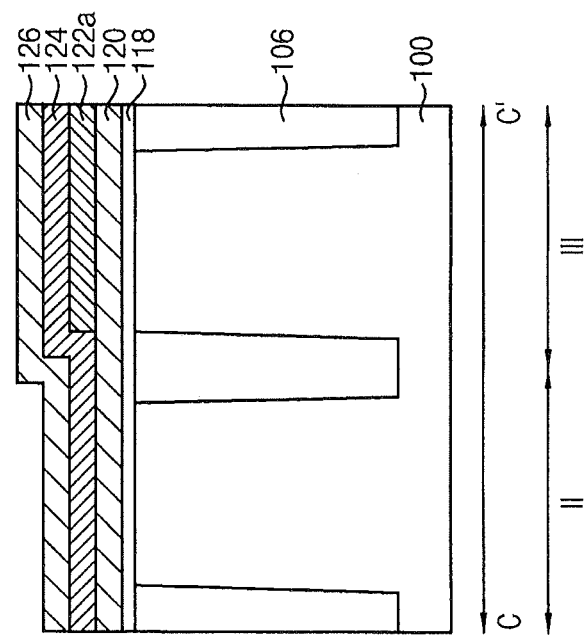
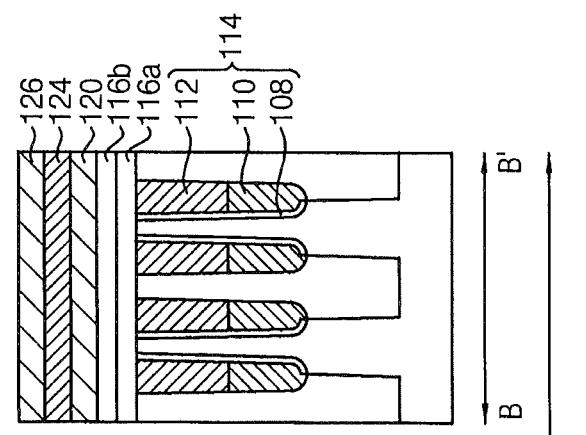
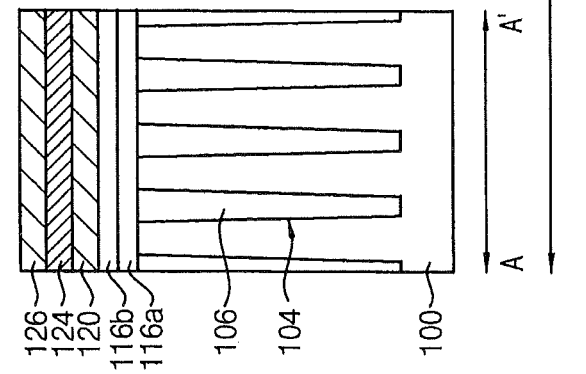

SEMICONDUCTOR DEVICES

CROSS-REFERENCE TO RELATED APPLICATION

This application claims priority under 35 USC §119 to Korean Patent Application No. 10-2013-0133055, filed on Nov. 4, 2013 in the Korean Intellectual Property Office (KIPO), the contents of which are herein incorporated by reference in their entirety.

BACKGROUND

Some embodiments disclosed herein relate to semiconductor devices. More particularly, some embodiments relate to highly integrated dynamic random access memory (DRAM) devices.

In a highly integrated semiconductor device, a wiring structure having a low resistance and a reduced parasitic capacitance is needed.

SUMMARY

Some embodiments provide a semiconductor device including a wiring structure and having good electrical characteristics.

According to some embodiments, there is provided a semiconductor device. The semiconductor device includes a substrate, a plurality of contact plugs, an insulation layer pattern, a first metal oxide layer pattern, a first metal pattern, a metal line, and a first planar transistor. The substrate may include a first region and a second region. The contact plugs contact the substrate in the first region. The insulation layer pattern is formed on the substrate in the first region between the contact plugs and has a top surface lower than that of the contact plugs. The first metal oxide layer pattern is formed on the insulation layer pattern and has a dielectric constant higher than that of silicon oxide. The first metal pattern is formed on the first metal oxide layer pattern and contacts sidewalls of the contact plugs. The metal line contacts top surfaces of the contact plugs and the first metal pattern. The first planar transistor includes a first gate structure containing a second metal oxide layer pattern, a second metal pattern and a third metal pattern sequentially stacked, and the second metal oxide layer pattern, the second metal pattern and the third metal pattern include materials substantially the same as those of the first metal oxide layer pattern, the first metal pattern and the metal line, respectively.

In some embodiments, the first metal pattern may include a first metal having a work function for a gate electrode of an NMOS transistor and/or a second metal having a work function for a gate electrode of a PMOS transistor.

In some embodiments, a portion of the first metal pattern directly contacting the first metal oxide layer pattern may include a metal substantially the same as that of the second metal pattern of the first gate structure.

In some embodiments, an adhesion layer pattern may be further formed between the first metal pattern and the metal line, and between the second metal pattern and the third metal pattern.

In some embodiments, each of the metal line and the third metal pattern may include an ohmic layer pattern, a barrier layer pattern and a metal layer pattern sequentially stacked.

In some embodiments, the contact plugs may include polysilicon.

In some embodiments, a first gate insulation layer pattern including silicon oxide may be formed under the metal oxide layer pattern of the first gate structure.

In some embodiments, the first gate insulation layer pattern may have a thickness smaller than that of the insulation layer pattern in the first region of the substrate.

In some embodiments, a second planar transistor may be formed in the second region of the substrate, and a conductivity type of the second planar transistor may be different from that of the first planar transistor.

In some embodiments, the second planar transistor may include a second gate structure containing a third metal oxide layer pattern, a lower metal pattern, a fourth metal pattern and a fifth metal pattern sequentially stacked, and the third metal oxide layer pattern, the fourth metal pattern and the fifth metal pattern may include materials substantially the same as those of the first metal oxide layer pattern, the first metal pattern and the metal line, respectively.

In some embodiments, the first metal pattern may include a metal having a work function for a gate electrode of an NMOS transistor, and the lower metal pattern may include a metal having a work function for a gate electrode of a PMOS transistor.

In some embodiments, a second gate insulation layer pattern may be formed under the third metal oxide layer pattern, and the second gate insulation layer pattern may include silicon oxide.

In some embodiments, a buried gate structure may be formed in the first region of the substrate.

In some embodiments, a top surface of the first metal pattern may be coplanar with or higher than a top surface of the contact plugs According to some embodiments, there is provided a semiconductor device. The semiconductor device may include multiple contacts plugs, an insulation layer pattern, a metal oxide layer pattern, a metal pattern and a metal line. The contact plugs contact a substrate. The insulation layer pattern is formed between the contact plugs and has a top surface lower than those of the contact plugs. The metal oxide layer pattern is formed on the insulation layer pattern, and has a dielectric constant higher than that of silicon oxide. The metal pattern is formed on the metal oxide layer pattern and contacts sidewalls of the contact plugs. The metal line contacts top surfaces of the contact plugs and the metal pattern and extends thereon.

In some embodiments, a resistance of a wiring structure in a cell region may be decreased. In addition, a height of the wiring structure may be reduced so that a parasitic capacitance therebetween may be decreased. A NMOS transistor and a PMOS transistor in a peripheral circuit region may include gate electrodes including a metal. Therefore, a performance of the semiconductor device may be improved.

Some embodiments of the present inventive concept are directed to a semiconductor device that includes multiple contact plugs contacting a substrate, a first metal oxide layer pattern between ones of the plurality of contacts, the first metal oxide layer pattern having a dielectric constant that is higher than that of silicon oxide, a first metal pattern on the first metal oxide layer pattern, and a metal line on the first metal pattern. The device may include a first planar transistor in a first region of the substrate, the first planar transistor including a first gate structure containing a second metal oxide layer pattern, a second metal pattern and a third metal pattern sequentially stacked, the second metal oxide layer pattern, the second metal pattern and the third metal pattern including materials substantially the same as those of the first metal oxide layer pattern, the first metal pattern and the metal line, respectively. The device may include a second planar transistor in a second region of the substrate, the second planar transistor includes a conductivity type that is different from that of the first planar transistor and including a second gate structure containing a third metal oxide layer pattern, a lower metal pattern, a fourth metal pattern and a fifth metal pattern sequentially stacked, and the third metal oxide layer pattern, the fourth metal pattern and the fifth metal pattern include materials substantially the same as those of the first metal oxide layer pattern, the first metal pattern and the metal line, respectively.

In some embodiments, the first metal pattern includes a metal having a work function for a gate electrode of an NMOS transistor, and the lower metal pattern includes a metal having a work function for a gate electrode of a PMOS transistor.

Some embodiments include comprising a second gate insulation layer pattern under the third metal oxide layer pattern, the second gate insulation layer pattern including silicon oxide.

Some embodiments include an insulation layer pattern between ones of the contact plugs, the insulation layer pattern having a top surface that is lower than top surfaces of the contact plugs.

In some embodiments, the first metal pattern contacts sidewalls of ones of the plurality of contact plugs and the metal line contacts top surfaces of the contact plugs and the first metal pattern.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

FIGS. 9 to 19 are cross-sectional views illustrating stages of methods of manufacturing the semiconductor device in FIGS. 6 and 7.

DESCRIPTION OF EMBODIMENTS

Figure 1:
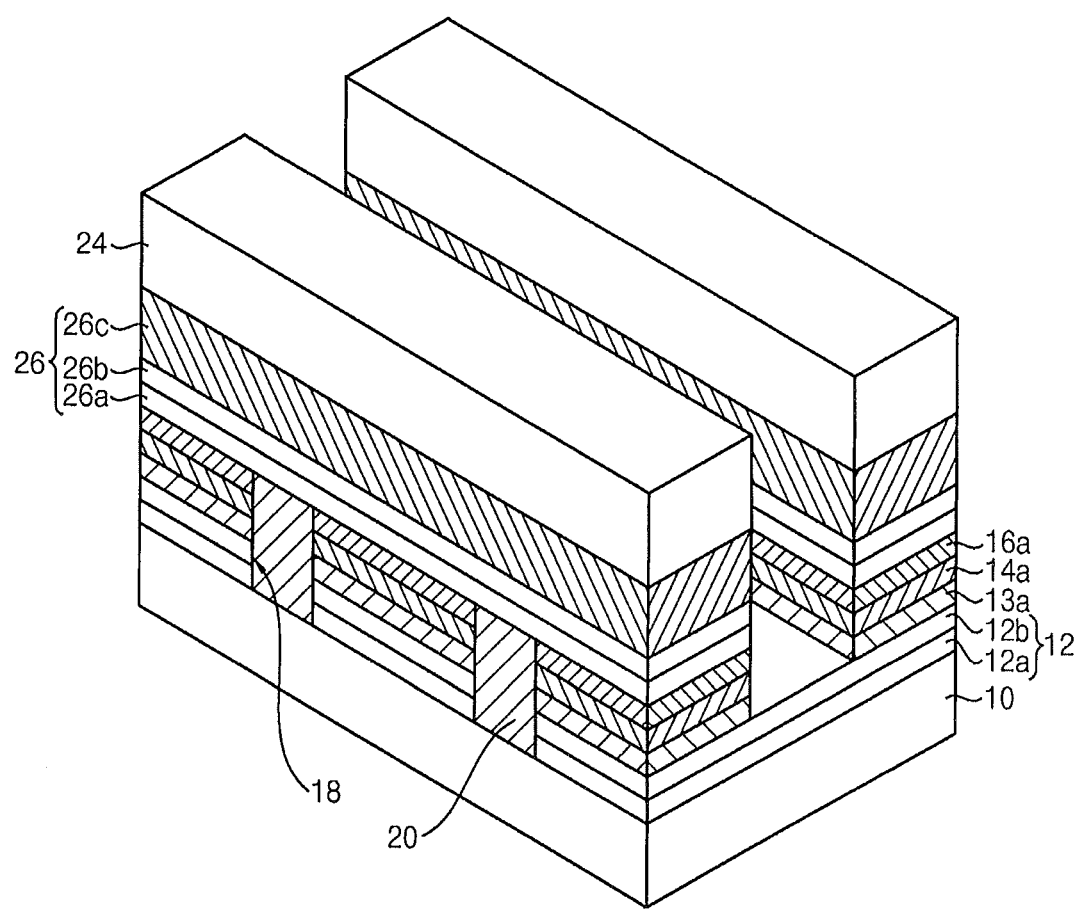
FIG. 1 is a perspective view illustrating a wiring of semiconductor devices in accordance with some embodiments of the present inventive concept.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of devices may be arranged in an array and/or in a two-dimensional pattern.

FIG. 1 is a perspective view illustrating a wiring structure of a semiconductor device in accordance with some embodiments of the present inventive concept.

Referring to FIG. 1, a substrate 10 having an active region and a field region may be provided. The substrate 10 may include a semiconductor material, e.g., single crystalline silicon.

The semiconductor device, e.g., a recess channel array transistor (RCAT) including a buried gate structure may be formed on the substrate 10.

Contact plugs 20 may contact the active region of the substrate 10. The contact plugs 20 may include a conductive material e.g., polysilicon, thereby having a good ohmic characteristic.

An insulation layer structure 12 and a metal oxide layer pattern 13a may be formed on the substrate 10 between the contact plugs 20. A top surface of the metal oxide layer pattern 13a may be lower than top surfaces of the contact plugs 20. The insulation layer structure 12 may have a single-layer structure or a multi-layered structure in which a plurality of insulation layers are stacked. The metal oxide layer pattern 13a may include a high dielectric material.

In some embodiments, the insulation layer structure 12 may include first and second insulation layers 12a and 12b sequentially stacked. The first insulation layer 12a may include a material different from that of the second insulation layer 12b. Each of the first and second insulation layers 12a and 12b may include insulating materials, e.g., silicon oxide, silicon oxynitride, silicon nitride, etc. In some embodiments, the insulation layer structure 12 may include the first insulation layer 12a only. In some embodiments, the insulation layer structure 12 may not be formed, and in such cases, only the metal oxide layer pattern 13a may be formed on the substrate 10.

A first metal layer pattern 14a may be formed on the metal oxide layer pattern 13a between the contact plugs 20. The first metal layer pattern 14a may contact sidewalls of the contact plugs 20. A bottom surface of the first metal layer pattern 14a may be lower than the top surfaces of the contact plugs 20. The first metal layer pattern 14a may include, e.g., a first metal for a gate electrode of a negative-channel metal oxide semiconductor (NMOS) transistor or a second metal for a gate electrode of a positive-channel metal oxide semiconductor (PMOS) transistor. In some embodiments, the first metal layer pattern 14a may have a structure in which the first metal and the second metal are stacked.

Some embodiments provide that the first metal may have a proper work function for the gate electrode of the NMOS transistor and/or the second metal may have a proper work function for the gate electrode of the PMOS transistor.

The first metal may have a work function under about 4.5 eV. Particularly, the first metal may have a work function in a range of about 4.1 eV to about 4.3 eV. The second metal may have a work function over about 4.5 eV. Particularly, the second metal may have a work function in a range of about 4.7 eV to about 4.9 eV. In some embodiments, the first metal layer pattern 14a may have a plurality of thin metal films.

An adhesion layer pattern 16a may be formed on the first metal layer pattern 14a. The adhesion layer pattern 16a may enhance an adhesive characteristic between the first metal layer pattern 14a and a metal line structure 26 thereon. In some embodiments, the adhesion layer pattern 16a may not be formed. The adhesion layer pattern 16a may include a conductive material, e.g., doped silicon, a metal silicide, etc.

The metal line structure 26 may be formed on top surfaces of the contact plugs 20 and the adhesion layer pattern 16a. The metal line structure 26 may include an ohmic layer pattern 26a, a barrier layer pattern 26b and a metal layer pattern 26c sequentially stacked.

The ohmic layer pattern 26a may include, e.g., a metal silicide. The barrier layer pattern 26b may include, e.g., titanium, titanium nitride, tantalum, tantalum nitride, etc. These may be used alone or in a combination thereof. The metal layer pattern 26c may include, e.g., tungsten, aluminum, copper, etc. These may be used alone or in a combination thereof.

A hard mask 24 may be formed on the metal line structure 26.

In some embodiments, the first metal layer pattern 14a may be formed beneath the metal line structure 26, which may contact the sidewalls of the contact plugs 20, and thus a resistance of the wiring structure may be decreased. In addition, a height of the metal line structure 26 may be reduced because of the first metal layer pattern 14a, and thus a parasitic capacitance between the metal line structures 26 may be decreased.

FIGS. 2 to 5 are perspective views illustrating stages of methods of manufacturing the wiring structure of the semiconductor device in FIG. 1.

Figure 2:
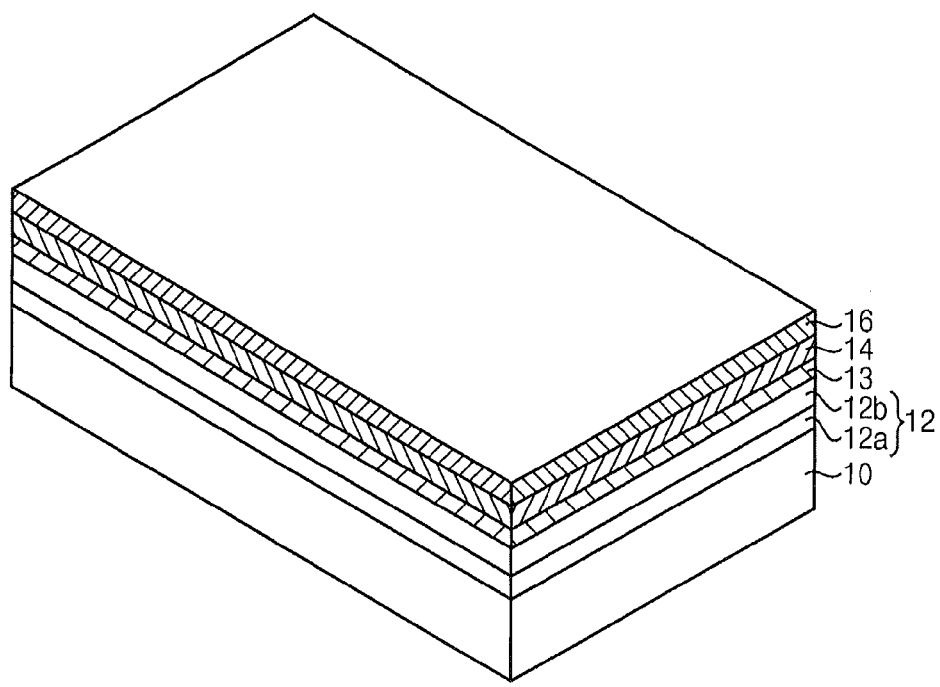
FIGS. 2 to 5 are perspective views illustrating stages of methods of manufacturing the wiring of the semiconductor device in FIG. 1.

Referring to FIG. 2, a substrate 10 may be provided. An isolation process may be performed on the substrate 10 to form an active region and a field region in the substrate 10. An insulation layer structure 12 and a metal oxide layer 13 may be formed on the substrate 10. The insulation layer structure 12 may be formed to have a single-layer structure or a multi-layered structure in which a plurality of insulation layers are stacked. In some embodiments, the insulation layer structure 12 may be formed to include first and second insulation layers 12a and 12b sequentially stacked.

A first metal layer 14 may be formed on the metal oxide layer 13. The first metal layer 14 may include a first metal for a gate electrode of an NMOS transistor and/or a second metal for a gate electrode of a PMOS transistor. The first metal may have a proper work function for the gate electrode of the NMOS transistor, and the second metal may have a proper work function for the gate electrode of the PMOS transistor.

An adhesion layer 16 may be formed on the first metal layer 14. In some embodiments, the adhesion layer 16 may not be formed.

Figure 3:
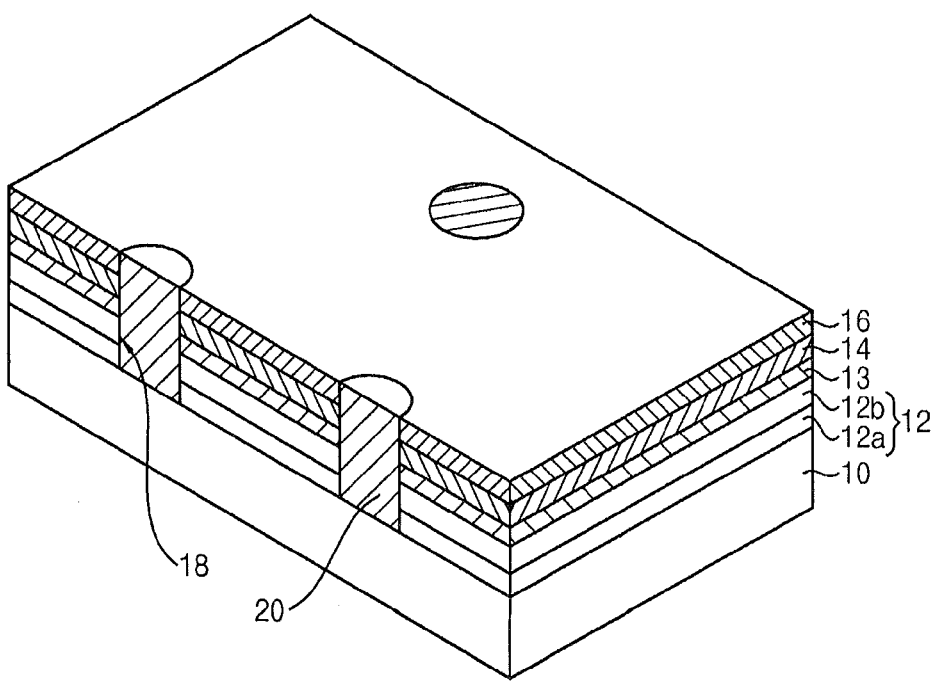

Referring to FIG. 3, portions of the adhesion layer 16, the first metal layer 14, the metal oxide layer 13 and the first and second insulation layers 12a and 12b may be sequentially etched to form contact holes 18 partially exposing the substrate 10. In the etching process, portions of the substrate 10 exposed by the contact holes 18 may be also etched.

A polysilicon layer may be formed on the exposed portions of the substrate 10 in the contact holes 18 and on the adhesion layer 16, and may be planarized until a top surface of the adhesion layer 16 may be exposed to form contact plugs 20 in the contact holes 18, respectively. The contact plugs 20 may contact the active region of the substrate 10.

Figure 4:
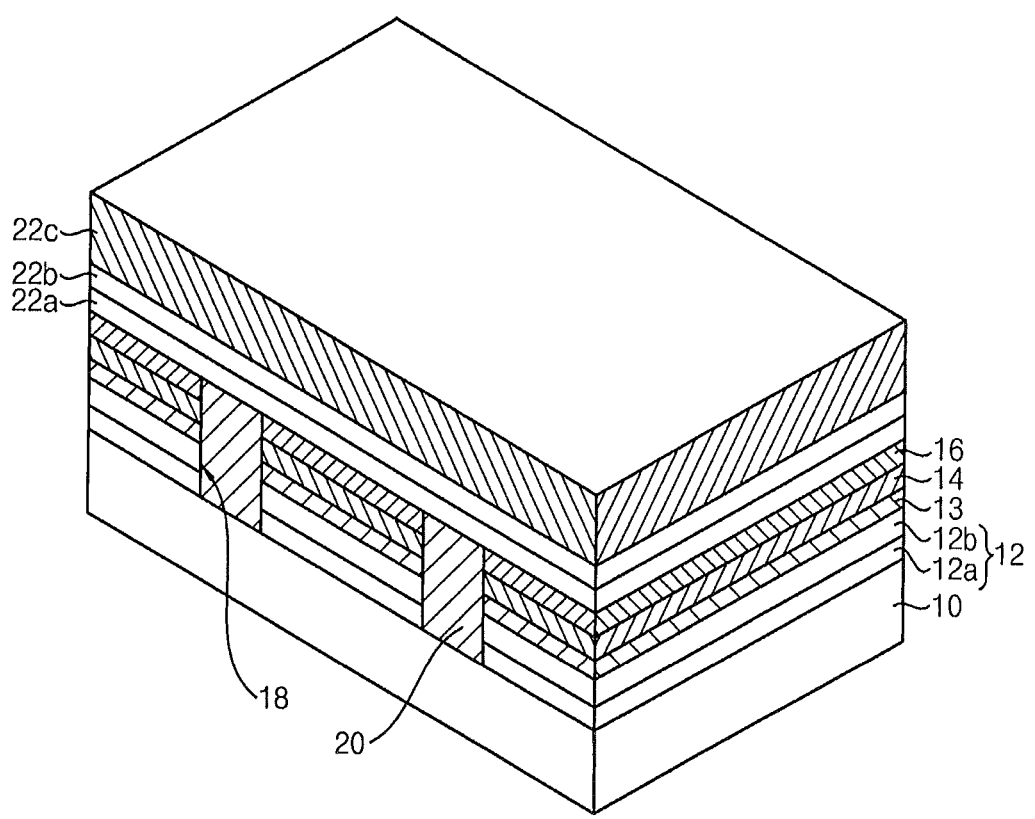

Referring to FIG. 4, an ohmic layer 22a, a barrier layer 22b and a second metal layer 22c may be formed on top surfaces of the contact plugs 20 and the adhesion layer 16. The ohmic layer 22a may be formed to directly contact the contact plugs 20. In some embodiments, the ohmic layer 22a may be formed to include, e.g., a metal silicide. The barrier layer 22b may be formed to include, e.g., titanium, titanium nitride, tantalum, tantalum nitride, etc. These may be used alone and/or in a combination thereof. The second metal layer 22c may be formed to include, e.g., tungsten, aluminum, copper, etc. These may be used alone or in a combination thereof.

Figure 5:
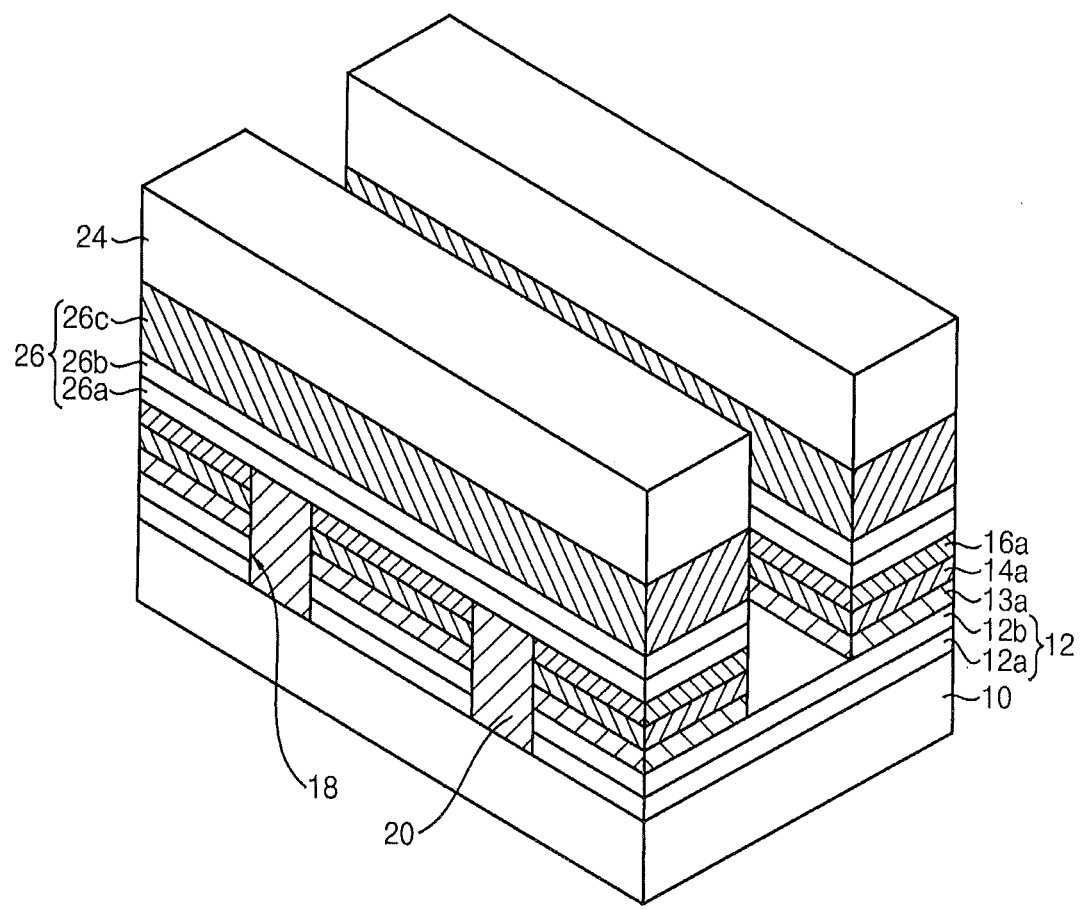

Referring to FIG. 5, a hard mask 24 may be formed on the second metal layer 22c. The hard mask 24 may be formed to include, e.g., silicon nitride or silicon oxide. The hard mask 24 may have a linear shape.

The second metal layer 22c, the barrier layer 22b, the ohmic layer 22a, the adhesion layer 16, the first metal layer 14 and the metal oxide layer 13 may be sequentially etched using the hard mask 24 as an etch mask to form a second metal layer pattern 26c, a barrier layer pattern 26b, an ohmic layer pattern 26a, an adhesion layer pattern 16a, a first metal layer pattern 14a and a metal oxide layer pattern 13a, respectively. A metal line structure 26 may be defined by the ohmic layer pattern 26a, the barrier layer pattern 26b and the second metal layer pattern 26c sequentially stacked.

Some embodiments provide that the metal oxide layer 13 may not be etched in the etching process and remain.

The first metal layer pattern 14a and the adhesion layer pattern 16a may contact sidewalls of the contact plug 20.

The metal line structure 26 may contact top surfaces of the adhesion layer pattern 16a and the contact plugs 20.

As illustrated above, the first metal layer pattern 14a may be formed to contact a bottom surface of the metal line structure 26, and thus a resistance of the wiring structure may be decreased because of the first metal line structure 14a. Additionally, a height of the metal line structure 26 may be decreased, and the wiring structure may have a target resistance. Furthermore, a parasitic capacitance between the metal line structures 26 may be decreased.

The wiring structure in FIG. 1 may be used in a various type of semiconductor devices. Hereinafter, a dynamic random access memory (DRAM) device including the wiring structure may be illustrated.

Figure 6:
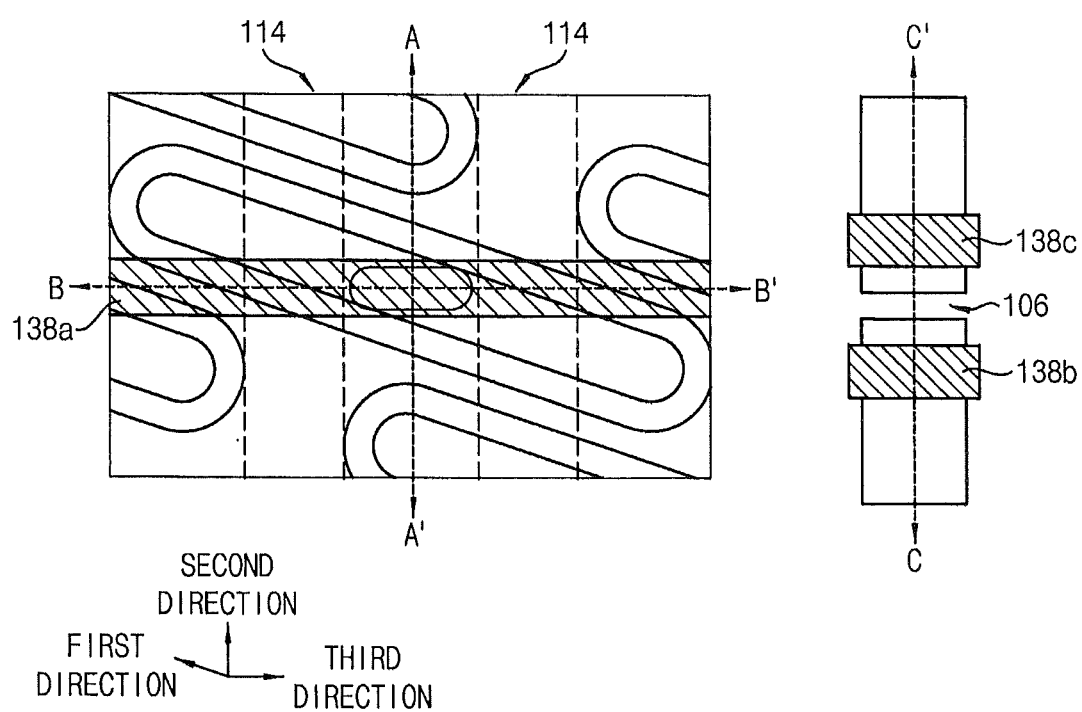
FIG. 6 is a plan view of a semiconductor device in accordance with some embodiments of the present inventive concept.
Figure 7:
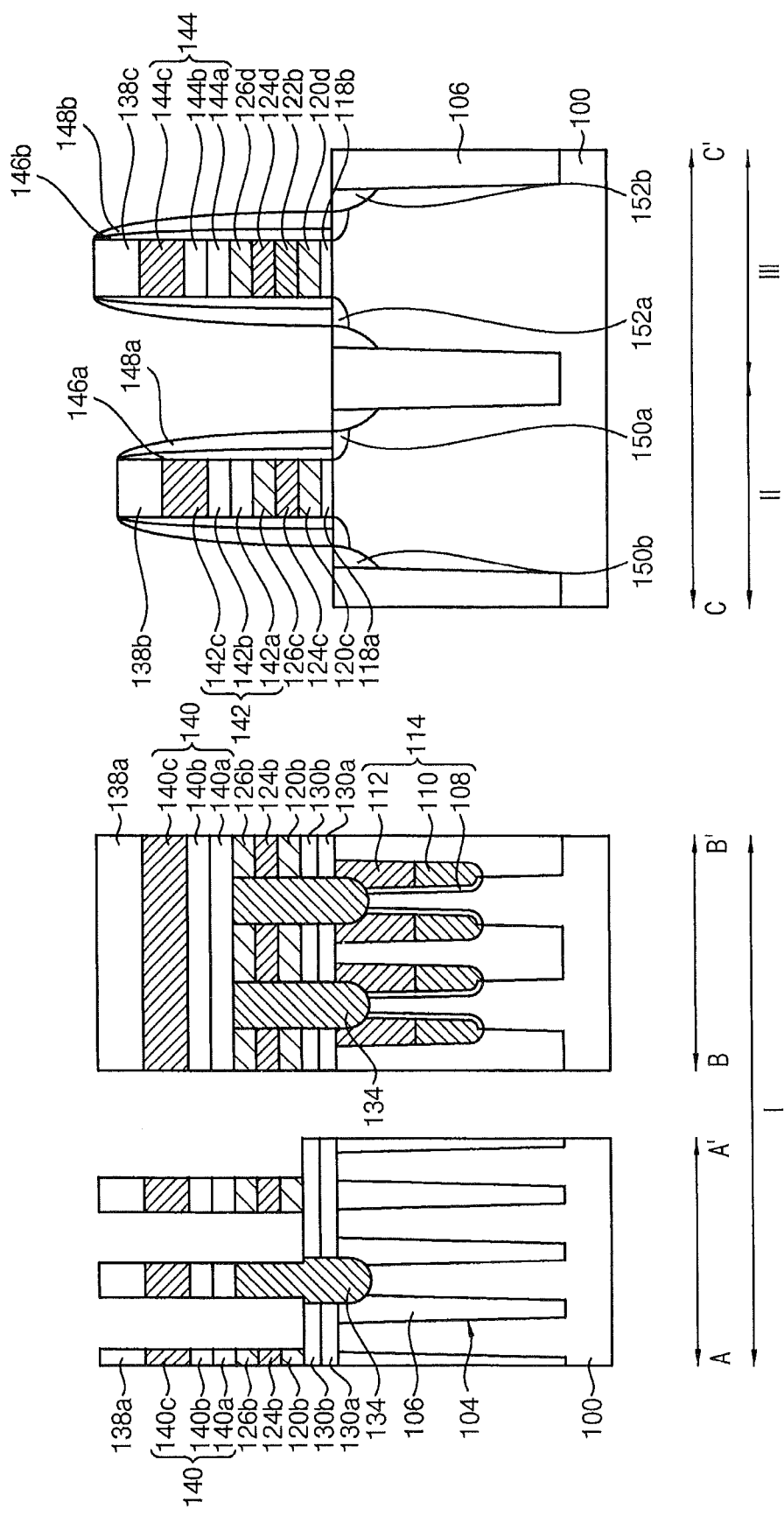
FIG. 7 is a cross-sectional view of the semiconductor device in accordance with some embodiments of the present inventive concept.

FIG. 6 is a plan view of a semiconductor device in accordance with some embodiments of the present inventive concept. FIG. 7 is a cross-sectional view of the semiconductor device of FIG. 6. Particularly, FIG. 7 includes cross-sectional views of the semiconductor device of FIG. 6 cut along lines A-A', B-B' and C-C', respectively.

Hereinafter in all drawings, a direction in which each active region extends and that is substantially parallel to a top surface of a substrate may be referred to as a first direction, a direction that may be substantially parallel to the top surface of the substrate but may be neither perpendicular nor parallel to the first direction may be referred to as a second direction, and a direction substantially parallel to the top surface of the substrate and substantially perpendicular to the second direction may be referred to as a third direction.

Referring to FIGS. 6 and 7, a substrate 100 may have first, second and third regions I, II and III. The first region I may serve as a cell region in which memory cells may be formed. The second and third regions II may serve as a peripheral region in which peripheral circuits may be formed. The substrate 100 may be a semiconductor substrate. Memory cells of a dynamic random access memory (DRAM) device may be formed in the first region I, and NMOS and PMOS transistors may be formed in the second and third regions II and III, respectively.

An isolation layer pattern 106 may be formed on the substrate 100. A region of the substrate 100 on which the isolation layer pattern 106 is formed may be defined as a field region, and a region of the substrate 100 on which no isolation layer pattern is formed may be defined as the active region. In example embodiments, a plurality of active regions may be formed, and each active region may extend in the first direction. The plurality of active regions in the first region I may have an island shape from each other.

A trench (not shown) may be formed in the first region of the substrate 100. A buried gate structure 114 may fill the trench, which may have a linear shape extending in the second direction.

A top surface of each active region may be divided into first, second and third contact regions by the trench. A central portion of the top surface of each active region may be a first contact region, and edge portions of the top surface of each active region may be second and thirds contact regions, respectively.

In some embodiments, a plurality of trenches spaced apart from each other may be formed. The buried gate structure 114 may include a buried gate insulation layer 108, a buried gate electrode 110 and a gate mask 112. The buried gate insulation layer 108 may be conformally formed on an inner wall of the trench. The buried gate electrode 110 may include, e.g., a metal and/or doped polysilicon. In some embodiments, the buried gate electrode 110 may have a structure in which a barrier layer and a metal layer may be sequentially stacked. The gate mask 112 may be formed on the buried gate electrode 110, and fill a remaining portion of the trench. The gate mask 112 may include a nitride, e.g., silicon nitride.

A contact plug 134 may be formed on the first contact region. A bottom surface of the contact plug 134 may be lower than a top surface of the isolation layer pattern 106. The contact plug 134 may include doped polysilicon, which may directly contact the substrate 100, and thus the contact plug 134 may have a good ohmic characteristic and a good adhesive characteristic.

An insulation layer structure may be formed on the substrate 100 between the contact plugs 134, which may include at least one insulation layer. In some embodiments, the insulation layer structure may include a first insulation layer pattern 130a and a second insulation layer pattern 130b sequentially stacked. A metal oxide layer pattern 120b may be formed on the insulation layer structure between the contact plugs 134. A top surface of the metal oxide layer pattern 120b may be lower than that of the contact plug 134.

The metal oxide layer pattern 120b may include a dielectric material having a dielectric constant substantially lower than that of silicon oxide. For example, the metal oxide layer pattern 120b may include, e.g., $Al_2O_3$, $HfO_2$, HfSiO, $ZrO_2$, ZrSiO, $LaO_2$, $TiO_2$, etc. These may be used alone and/or in a combination thereof. The metal oxide layer pattern 120b may include substantially the same material as that of a gate insulation layer of transistors in the second and third regions II and III.

The first and second insulation layer patterns 130a and 130b may include materials different from each other. Each of the first and second insulation layer patterns 130a and 130b may include, e.g., silicon oxide, silicon oxynitride and/or silicon nitride. Some embodiments provide that the insulation layer structure may include only the first insulation layer pattern 130a. In some embodiments, the insulation layer structure may not be formed, and thus only the metal oxide layer pattern 120b may be formed on the substrate 100.

A first metal layer pattern 124b may be formed on the metal oxide layer pattern 120b between the contact plugs 134. The first metal layer pattern 124b may contact sidewalls of the contact plugs 134. A bottom surface of the first metal layer pattern 124b may be lower than that of the contact plug 134.

The first metal layer pattern 124b may have a structure substantially the same as that of a gate electrode of the transistors in the second and third regions II and III, and the first metal layer pattern 124b may include a first metal for forming a gate electrode of an NMOS transistor or a second metal for forming a gate electrode of a PMOS transistor.

The first metal may have a proper work function for the gate electrode of the NMOS transistor. The second metal may have a proper work function for the gate electrode of the PMOS transistor.

In some embodiments, the first metal layer pattern 124b may have a structure including two layers that are sequentially stacked and include the first and second metals, respectively.

The first metal may have a work function under about 4.5 eV. Some embodiments provide that the first metal may have a work function in a range of about 4.1 eV to about 4.3 eV. The second metal may have a work function over about 4.5 eV. Particularly, the second metal may have a work function in a range of about 4.7 eV to about 4.9 eV.

The first metal may include, e.g., Mg/TiN, TiN/Mg/TiN, La/TiN, TiN/La/TiN, St/TiN, TiN/SrTiN, TaN/TiON, Mg/TaN, TaN/Mg/TaN, La/TaN, TaN/La/TaN, St/TaN, TaN/SrTsN, etc.

The second metal may include, e.g., TiN, Al/TiN, TiN/Al/TiN, TiN/TiON, Ta/TiN, TaN/TiN, TaN, Al/TaN, TaN/Al/TaN, TaN/TaON, Ta/TaN, etc.

In some embodiments, the first metal layer pattern 124b may include the first metal for forming a gate electrode of the NMOS transistor in the second region II, and hereinafter, the first metal layer pattern 124b may be referred as a first n-type metal layer pattern 124b.

A first adhesion layer pattern 126b may be formed on the first n-type metal layer pattern 124b between the contact plugs 134. The first adhesion layer pattern 126b may include a semiconductor material doped with impurities, e.g., doped polysilicon.

A bit line 140 may be formed on top surfaces of the contact plugs 134 and the first adhesion layer pattern 126b. The bit line 140 may include, e.g., a metal. The bit line 140 may have a structure in which a first ohmic layer pattern 140a, a first barrier layer pattern 140b and a first metal layer pattern 140c are sequentially stacked. The bit line 140 may extend in the third direction.

In some embodiments, the first ohmic layer pattern 140a may include a metal silicide. The first barrier layer pattern 140b may include, e.g., titanium, titanium nitride, tantalum, tantalum nitride, etc. These may be used alone and/or in a combination thereof. The first metal layer pattern 140c may include, e.g., tungsten, aluminum, copper, etc. These may be used alone and/or in a combination thereof.

A first hard mask 138a may be formed on the bit line 140. The first hard mask 138a may include, e.g., silicon oxide or silicon oxide.

An insulating interlayer (not shown) may cover the bit line 140. Storage node contacts (not shown) may contact the second and third contact regions through the insulating interlayer. Capacitors (not shown) may be formed on the storage node contacts, respectively.

Hereinafter, transistors in the second and third regions II and III of the substrate 100 will be illustrated. In some embodiments, NMOS and PMOS transistors may be formed in the second and third regions II and III of the substrate 100, respectively. In some embodiments, only one of the NMOS and PMOS transistors may be formed on the substrate 100. In such cases, a region on which either the NMOS transistor or PMOS transistor is formed may be referred as the second region II.

The NMOS transistor may include a first gate structure in which a first gate insulation layer pattern 118a, a second gate insulation layer pattern 120c, a second n-type metal layer pattern 124c, a second adhesion layer pattern 126c, a first upper metal layer pattern structure 142 and a second hard mask 138b are sequentially stacked on the substrate 100. N-type impurity regions 150a and 150b may be formed at upper portions of the substrate 100 adjacent the first gate structure. The n-type impurity regions 150a and 150b may serve as source and drain regions. The NMOS transistor may further include a first spacer on sidewalls of the first gate structure. The first spacer may include a first offset spacer 146a and a first main spacer 148a.

The first gate insulation layer pattern 118a may include silicon oxide that may be formed by an oxidation process on a top surface of the substrate 100.

The second gate insulation layer pattern 120c may include a dielectric material having a dielectric constant higher than that of silicon oxide. The second gate insulation layer pattern 120c may include substantially the same material as the metal oxide layer pattern 120b in the first region I. The second n-type metal layer pattern 124c may include the first metal having a proper work function for a gate electrode of the NMOS transistor. The second n-type metal layer pattern 124c may include substantially the same material as that of the first n-type metal layer pattern 124b in the first region I. The second adhesion layer 126c may include a material substantially the same as that of the first adhesion layer 126b.

The first upper metal layer pattern structure 142 may have a structure substantially the same as that of the bit line 140, and thus the first upper metal layer pattern structure 142 may include substantially the same material as that of the bit line 140. The first upper metal layer pattern structure 142 may have a structure in which a second ohmic layer pattern 142a, a second barrier layer pattern 142b and a second metal layer pattern 142c are sequentially stacked. The second hard mask 138b may include substantially the same material as that of the first hard mask 138a.

The bit line 140 and the first gate structure may have substantially the same structure as each other.

The PMOS transistor may include a second gate structure in which a third gate insulation layer pattern 118b, a fourth gate insulation layer pattern 120d, a first p-type metal layer pattern 122b, a third n-type metal layer pattern 124d, a third adhesion layer pattern 126d, a second upper metal layer pattern structure 144 and a third hard mask 138c are sequentially stacked on the substrate 100. P-type impurity regions 152a and 152b may be formed at upper portions of the substrate 100 adjacent the second gate structure. The p-type impurity regions 152a and 152b may serve as source and drain regions. The PMOS transistor may further include a second spacer on sidewalls of the second gate structure. The second spacer may include a second offset spacer 146b and a second main spacer 148b The third gate insulation layer pattern 118b may include silicon oxide The fourth gate insulation layer pattern 120d may include a dielectric material having a dielectric constant higher than that of silicon oxide. The fourth gate insulation layer pattern 120d may include substantially the same material as that of the first gate insulation layer pattern 118a. The fourth gate insulation layer pattern 120d may include substantially the same material as that of the second gate insulation layer pattern 120c and the metal oxide layer pattern 120b in the first and second regions I and II, respectively.

The first p-type metal layer pattern 122b may include the second metal having a proper work function a gate electrode of a PMOS transistor.

The third n-type metal layer pattern 124d may include substantially the same material as the first and second n-type metal layer patterns 124b and 124c in the first region I of the substrate 100. The third adhesion layer 126d may include a material substantially the same as that of the first and second adhesion layers 126b and 126c.

The second upper metal layer pattern structure 144 may have a structure substantially the same as that of the first upper metal layer pattern structure 142 and the bit line 140, and thus the second upper metal layer pattern structure 144 may include substantially the same material as that of the first upper metal layer pattern structure 142 and the bit line 140. The second upper metal layer pattern structure 144 may have a structure in which a third ohmic layer pattern 144a, a third barrier layer pattern 144b and a third metal layer pattern 144c are sequentially stacked. The third hard mask 138c may include substantially the same material as those of the first and second hard masks 138a and 138b.

As illustrated above, the semiconductor device may include the first metal layer pattern 124b contacting the bit line 140, and thus a resistance of the bit line 140 may be decreased. In addition, a height of the bit line 140 may be reduced so that a parasitic capacitance therebetween may be decreased.

The NMOS and PMOS transistors in the second and third regions II and III, respectively, may include first to fourth gate insulation layer patters 118a, 120c, 124c and 120d in the first and second gate structures. The first and second gate insulation layer patterns 118a and 118b may include the dielectric material having a high dielectric constant. Therefore, a performance of the semiconductor device may be improved.

Figure 8:
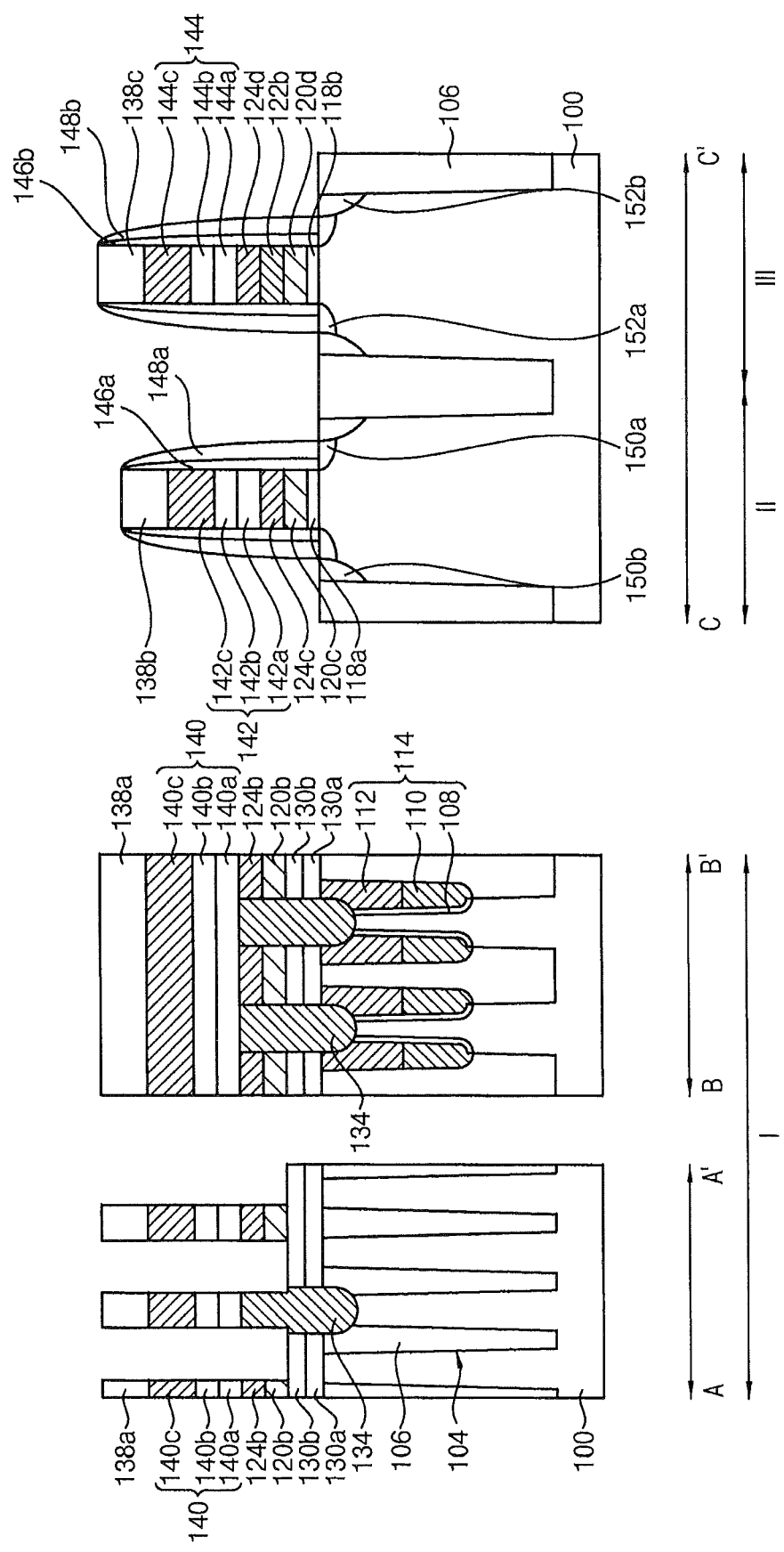
FIG. 8 is a cross-sectional view of a semiconductor device in accordance with some embodiments of the present inventive concept.

FIG. 8 is a cross-sectional view of a semiconductor device in accordance with some embodiments.

The semiconductor device in FIG. 8 may be substantially the same as or similar to that of FIG. 7 except for first to third adhesion layer patterns. Thus, like reference numerals refer to like elements, and detailed descriptions thereon are omitted herein.

An adhesion layer pattern may not be formed on the first metal layer pattern 124b in the first region I of the substrate 100. Therefore, the bit line 140 may be formed on top surfaces of the first metal layer pattern 124b and the contact plugs 134.

The NMOS transistor may include the first gate structure in which the first gate insulation layer pattern 118a, the second gate insulation layer pattern 120c, the second n-type metal layer pattern 124c, the first upper metal layer pattern structure 142 and the second hard mask 138b are sequentially stacked on the substrate 100 in the second region II.

The PMOS transistor may include the second gate structure in which the third gate insulation layer pattern 118b, the fourth gate insulation layer pattern 120d, the first p-type metal layer pattern 122b, the third n-type metal layer pattern 124d, the second upper metal layer pattern structure 144 and the third hard mask 138c are sequentially stacked on the substrate 100 in the third region III of the substrate 100.

FIGS. 9 to 19 are cross-sectional views illustrating stages of methods of manufacturing the semiconductor device in FIGS. 6 and 7.

Each of FIGS. 9 to 19 includes cross-sectional views of the semiconductor device cut along lines A-A', B-B' and C-C', respectively.

Figure 9:
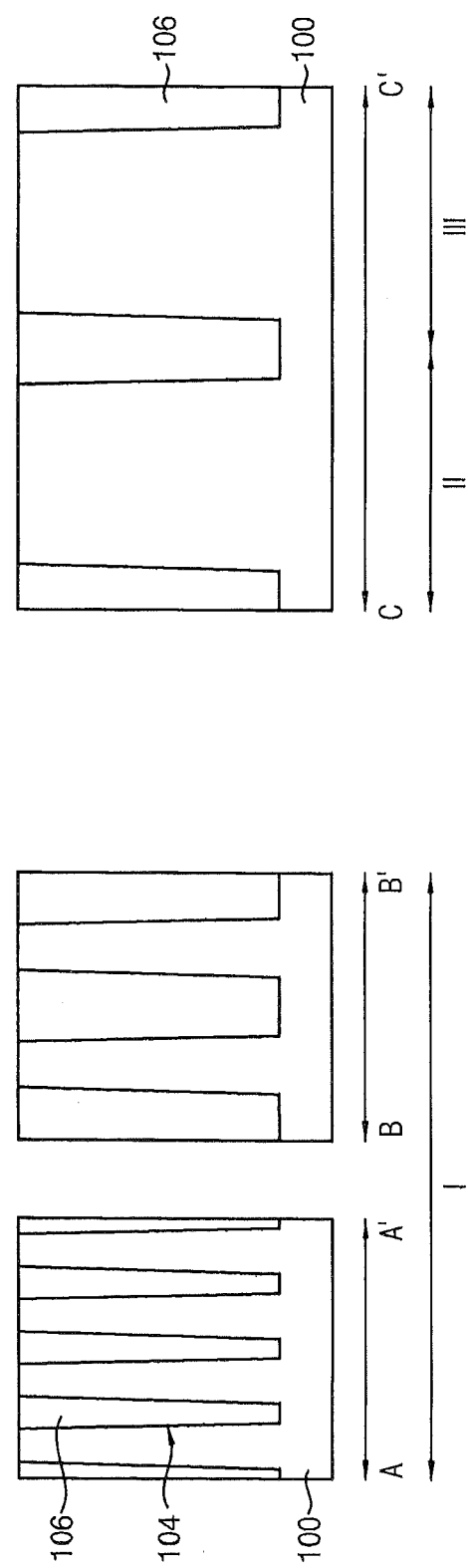

Referring to FIG. 9, a substrate 100 having first, second and third regions I, II and III therein may be provided. The substrate 100 may include a semiconductor material, e.g., silicon, germanium, etc. A buried gate structure 114 (refer to FIG. 10) may be formed in the first region I of the substrate 100, and NMOS and PMOS transistors may be formed in the second and third regions II and III of the substrate 100, respectively.

The substrate 100 may be partially etched to form a first trench 104, and a portion of the substrate 100 relatively protruding from other portions thereof due to the first trench 104 may be defined as an active region.

In some embodiments, a plurality of active regions having an island shape from each other may be formed in the first direction in the first region I. The buried gate structure 114 may be formed to extend in the second direction, and a bit line 140 (refer to FIG. 18) may be formed to extend in the third direction.

An isolation layer may be formed on the substrate 100 to sufficiently fill the first trench 104, and an upper portion of the isolation layer may be planarized to form an isolation layer pattern 106 filling the first trench 104. The isolation layer may be formed to include an insulating material, e.g., silicon oxide.

Impurities may be implanted into the substrate 100 to form a well (not shown) therein. In addition, a doping process may be performed on the substrate 100 to control a threshold voltage of transistors that may be subsequently formed in substrate 100.

Figure 10:
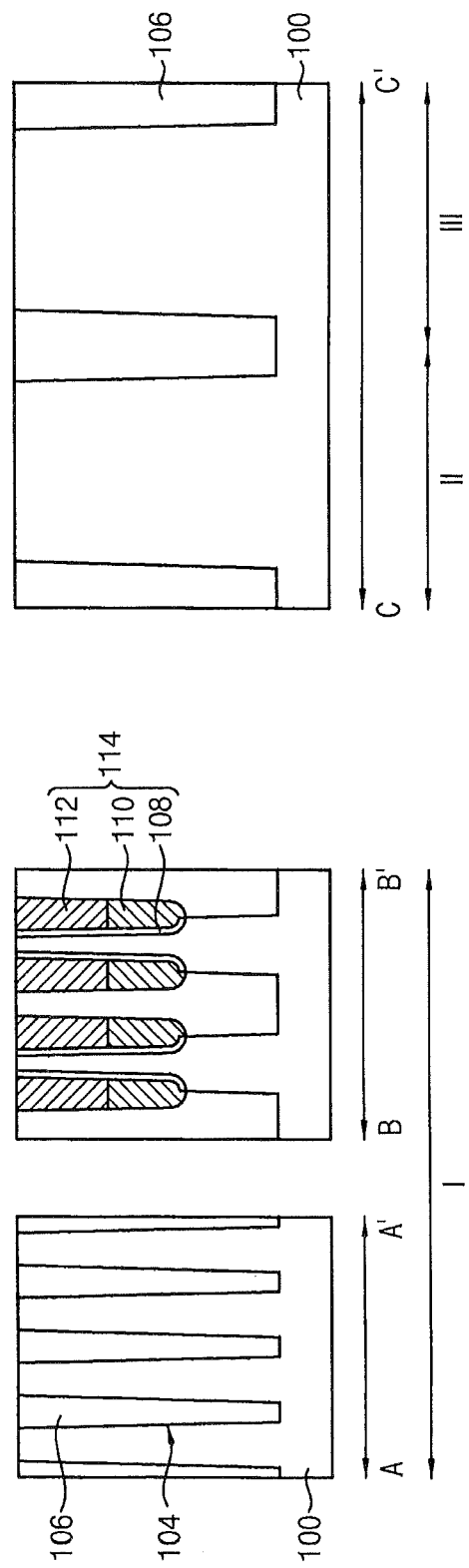

Referring to FIG. 10, a portion of the substrate 100 in the first region I may be partially etched to form a second trench (not shown) therein, which may have a linear shape extending in the second direction. In some embodiments, two second trenches spaced apart from each other may be formed in each active region.

A top surface of each active region may be divided into three portions, e.g., a central portion and two edge portions by the second trenches, which may serve as first, second and third contact regions, respectively.

A buried gate insulation layer 108 may be conformally formed on an inner wall of the second trench. The buried gate insulation layer 108 may be formed to include, e.g., silicon oxide. The buried gate insulation layer 108 may be formed by a thermal oxidation process and/or a chemical vapor deposition (CVD) process on the substrate 100. A conductive layer may be formed on the buried gate insulation layer 108 to sufficiently fill the second trench. In some embodiments, the conductive layer may have a structure in which a barrier layer and a metal layer are sequentially stacked. The barrier layer may be formed to include, e.g., titanium, titanium nitride, tantalum, tantalum nitride, etc. These may be used alone or in a combination thereof. The metal layer may be formed to include, e.g., tungsten. The conductive layer may be planarized by a chemical mechanical polishing (CMP) process and/or an etch back process to form a buried gate electrode 110 filling a lower portion of the second trench. A gate mask layer may be formed on the buried gate electrode 110, the buried gate insulation layer 108 and the substrate 100 to sufficiently fill a remaining portion of the second trench. An upper portion of the gate mask layer may be planarized to form a gate mask 112 in the second trench. The gate mask 112 may be formed to include, e.g., silicon nitride.

The buried gate structure 114 may be formed in the substrate 100 having the isolation layer pattern 106 thereon by the above processes. The buried gate structure 114 may be formed to include the buried gate insulation layer 108, the buried gate electrode 110 and the gate mask 112 in the second trench, which may have a linear shape extending in the second direction.

Figure 11:
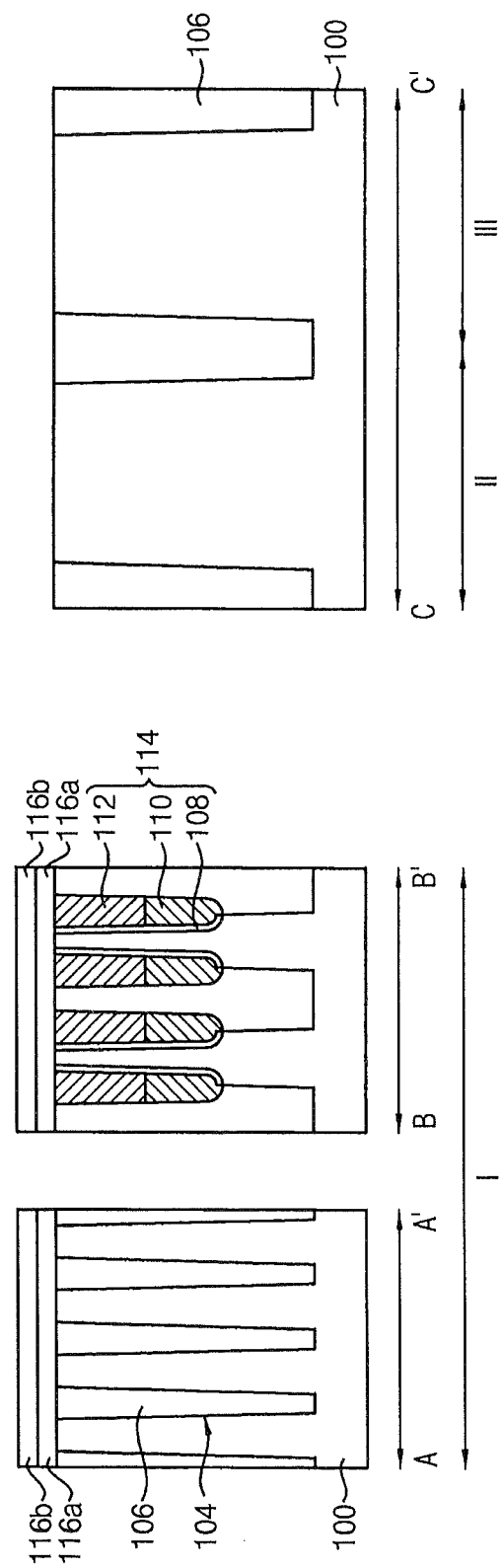

Referring to FIG. 11, first and second insulation layers may be sequentially formed on top surfaces of the gate mask 112, the buried gate insulation layer 108, the isolation layer pattern 106 and the substrate 100. The first and second insulation layers may be formed to include different materials from each other.

A first mask (not shown), e.g., a first photoresist pattern may be formed on the second insulation layer in the first region I. Portions of the first and second insulation layers in the second and third regions II and III may be removed using the first mask as an etch mask. Hereinafter, portions of the first and second insulation layers remaining in the first region I may be referred to as first and second preliminary insulation layer patterns 116a and 116b, respectively. The portions of the first and second insulation layers in the second and third regions II and III may be removed by a wet etch process or a dry etch process. In some embodiments, the first insulation layer may be removed by a wet etch process in order to reduce a damage to the substrate 100.

Top surfaces of the substrate 100 in the second and third regions II and III may be exposed by the etching process.

Some embodiments provide that the second insulation layer and thus the second preliminary insulation layer pattern 116b may not be formed, but only the first preliminary insulation layer pattern 116a may be formed in the first region I. In some embodiments, neither the first insulation layer (the first preliminary insulation layer pattern 116a) nor the second insulation layer (the second preliminary insulation layer pattern 116b) may be formed in the first region I.

Figure 12:
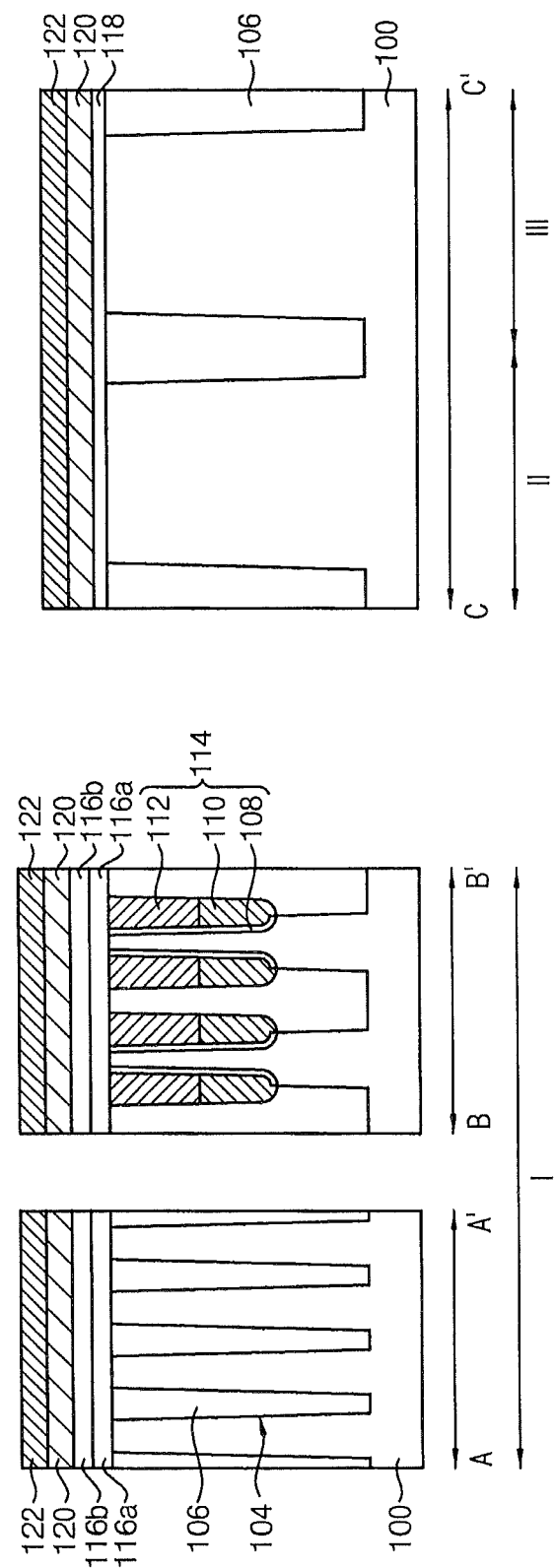

Referring to FIG. 12, the exposed top surfaces of the substrate 100 in the second and third regions II and III may be oxidized to form a first gate insulation layer 118. The first gate insulation layer 118 may serve as a pad layer, which may prevent the substrate 100 from directly contacting a metal oxide layer 120 subsequently formed. The first gate insulation layer 118 may be formed by performing an oxidation process on the exposed top surfaces of the substrate 100 in the second and third regions II and III, or may be formed by natural oxidation. The first gate insulation layer 118 may have a thickness less than about 1000 Å. A top surface of the substrate 100 in the first region I may not be exposed due to the first and second preliminary insulation layer patterns 116a and 116b, and thus no oxide layer may be formed thereon even if the oxidation process is performed.

The metal oxide layer 120 may be formed on the first gate insulation layer 118 and the second preliminary insulation layer pattern 116b, which may include a dielectric material having a dielectric constant higher than silicon oxide.

A p-type metal layer 122 may be formed on the metal oxide layer 120. The p-type metal layer 122 may be used for forming a gate electrode of the PMOS transistor.

Figure 13:
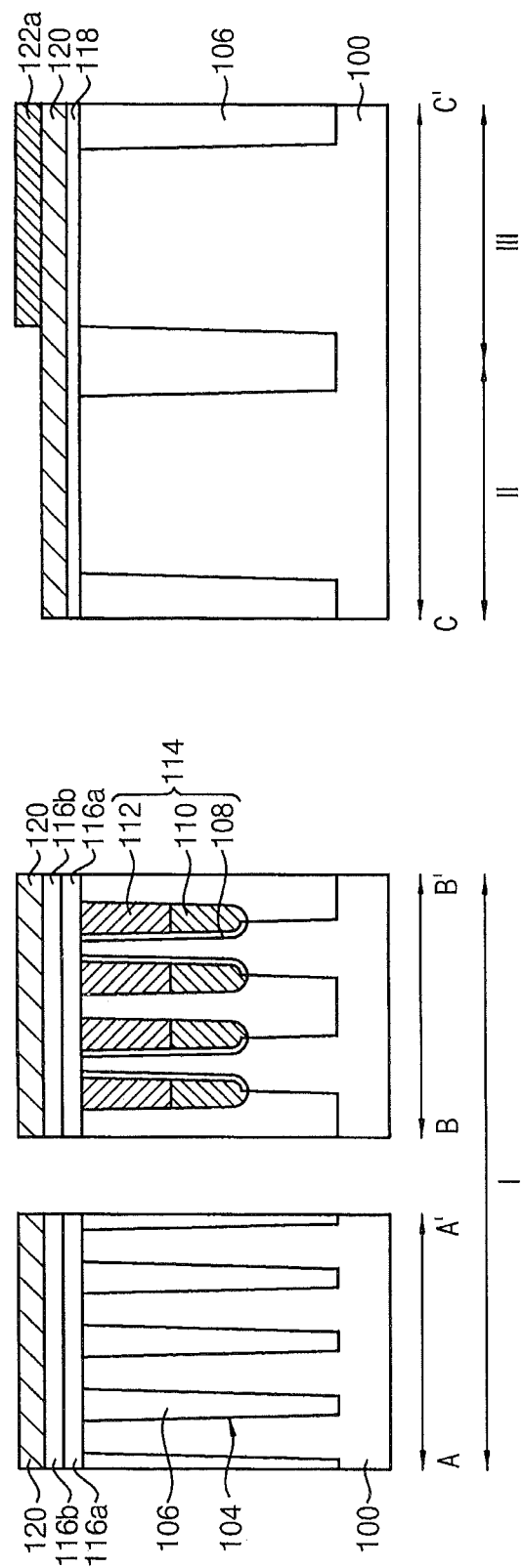

Referring to FIG. 13, a second mask (not shown), e.g., a second photoresist pattern covering the third region III may be formed on the p-type metal layer 122. Portions of the p-type metal layer 122 in the first and second regions I and II may be etched using the second mask as an etch mask to form a preliminary p-type metal layer pattern 122a in the third region III. The etching process may be performed by a wet etch process or a dry etch process.

By the etching process, portions of the metal oxide layer 120 in the first and second regions I and II may be exposed.

Referring to FIG. 14, an n-type metal layer 124 may be formed on the metal oxide layer 120 and the preliminary p-type metal layer pattern 122a. The n-type metal layer 124 may include a metal having a proper work function for a gate electrode of the NMOS transistor.

The n-type metal layer 124 may be formed on the metal oxide layer 120 in the first and second regions I and II, and thus substantially the same structure having the metal oxide layer 120 and the n-type metal layer 124 sequentially stacked may be formed in both of the first and second regions I and II.

The preliminary p-type metal layer pattern 122a and the n-type metal layer 124 may be sequentially stacked on a portion of the metal oxide layer 120 in the third region III. Thus, a top surface of the n-type metal layer 124 in the third region III may be formed to be higher than that of the n-type metal layer 124 in the second region II.

An adhesion layer 126 may be formed on the n-type metal layer 124. In some embodiments, the adhesion layer 126 may not be formed, and in such cases, the semiconductor device of FIG. 8 may be manufactured.

Figure 15:
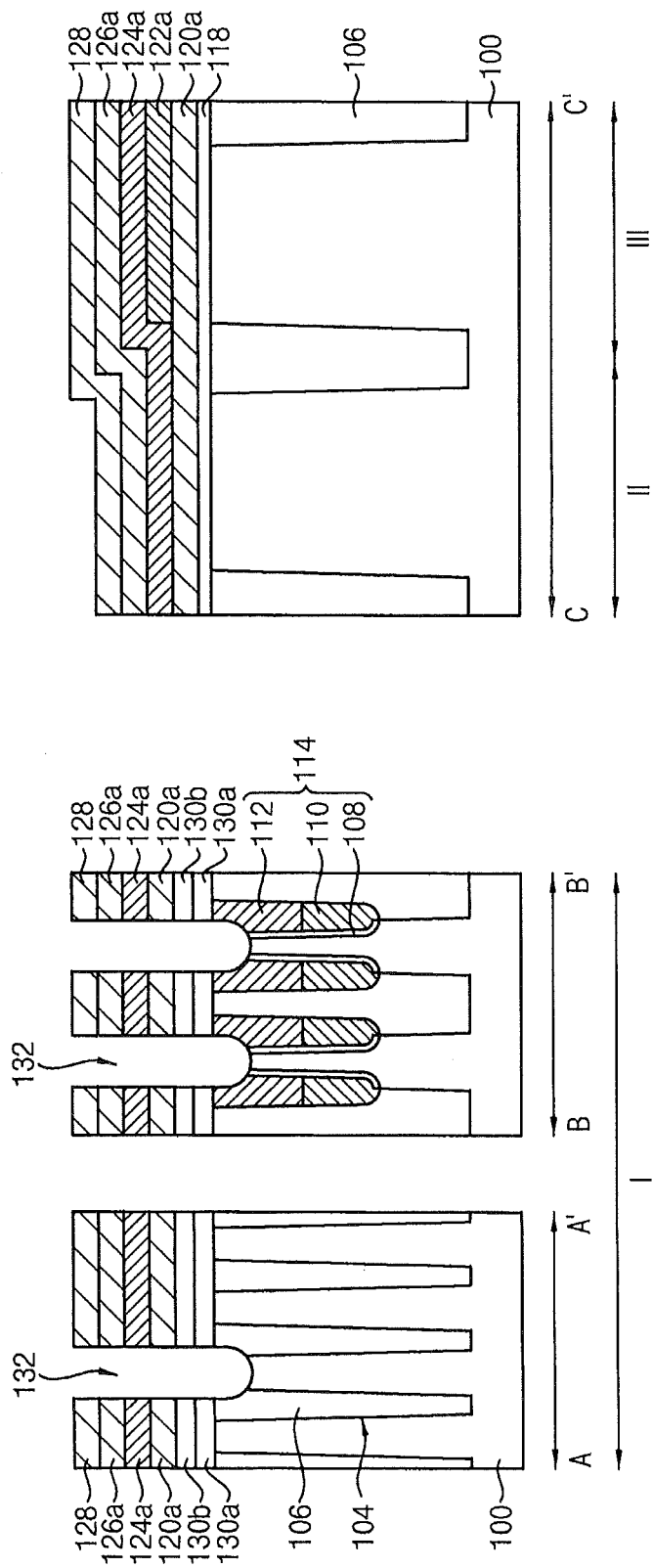

Referring to FIG. 15, a third mask 128 may be formed on the adhesion layer 126 to expose a portion of the adhesion layer 126 overlapping the first contact region of the substrate 100. The third mask 128 may be formed to include an insulating material, e.g., silicon oxide or silicon nitride.

The adhesion layer 126, the n-type metal layer 124, the metal oxide layer 120, the second preliminary insulation layer pattern 116b and the first preliminary insulation layer pattern 116a may be sequentially etched using the third mask 128 as an etch mask to form contact holes 132. The contact holes 132 may be formed to expose the first contact region of the substrate 100. By the etching process, the adhesion layer 126, the n-type metal layer 124, the metal oxide layer 120, the second preliminary insulation layer pattern 116b and the first preliminary insulation layer pattern 116a may be converted into a preliminary adhesion layer pattern 126a, a preliminary n-type metal layer pattern 124a, a preliminary metal oxide layer pattern 120a, a second insulation layer pattern 130a and a first insulation layer pattern 130b, respectively.

In the etching process, a portion of the substrate 100 may be also etched so that bottom surfaces of the contact holes 132 may be formed to be lower than a top surface of the isolation layer pattern 106. A width of the contact holes 132 may be wider than that of the first contact region.

Figure 16:
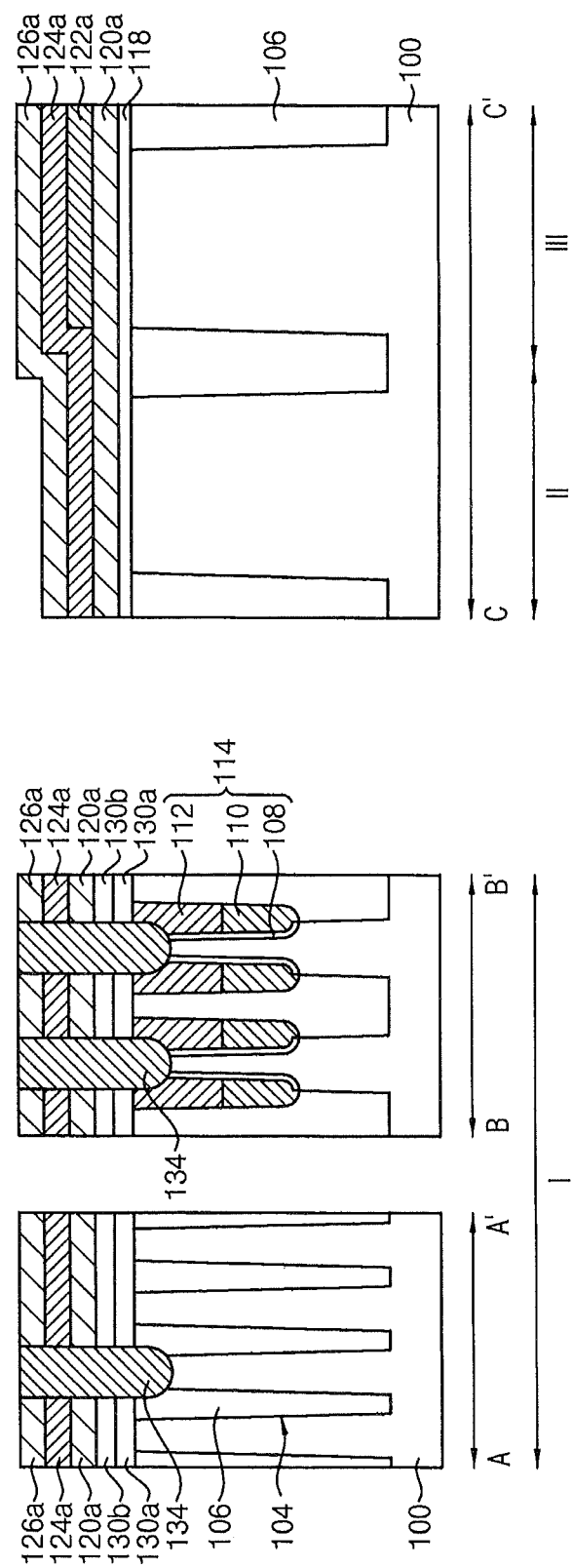

Referring to FIG. 16, a polysilicon layer may be formed to sufficiently fill the contact holes 132, and an upper portion of the polysilicon layer may be planarized to form contact plugs 134 in the contact holes 132, respectively. The planarization process may be performed by an etch back process and/or a CMP process. The contact plugs 134 may be formed to include doped polysilicon, and thus the contact plugs 134 may have a good ohmic characteristic.

Figure 17:
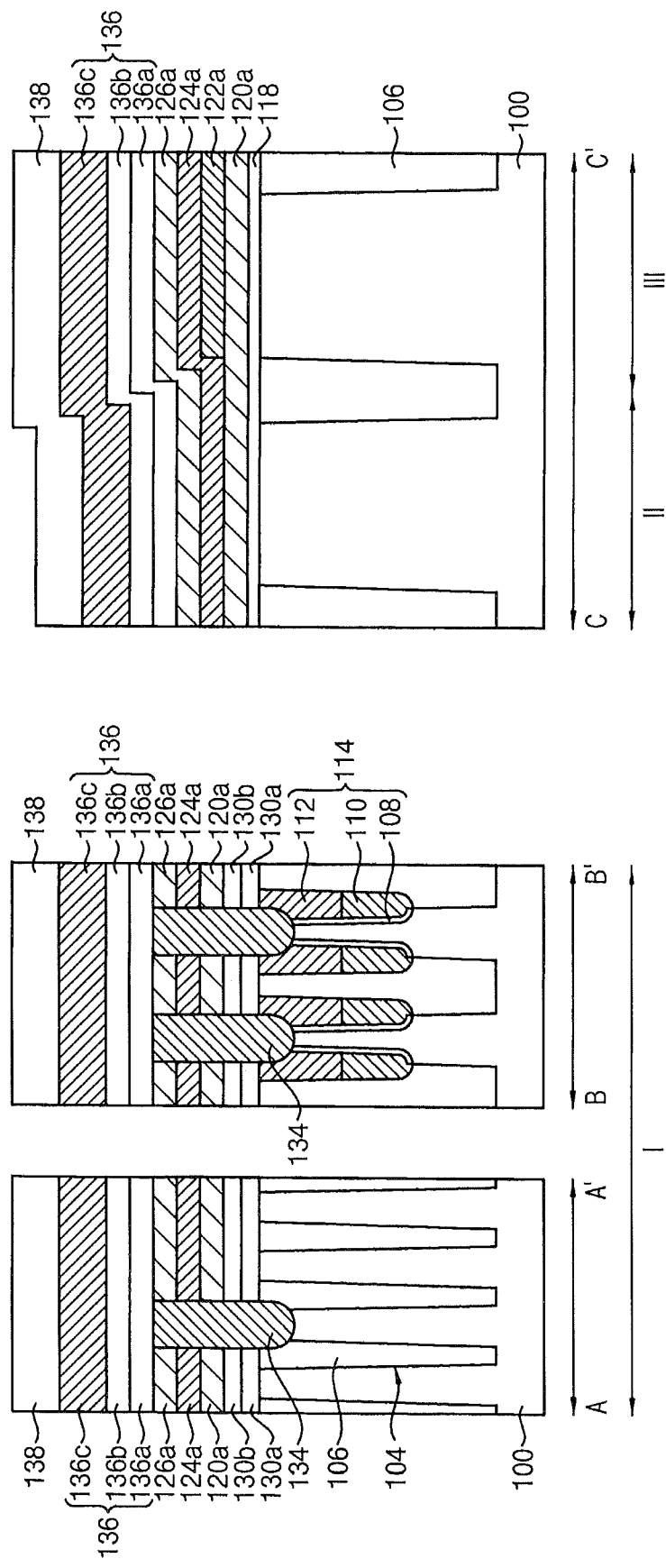

Referring to FIG. 17, a first metal layer structure 136 may be formed on top surfaces of the contact plugs 134 and the preliminary adhesion layer pattern 126a. In some embodiments, the first metal layer structure 136 may be formed to include an ohmic layer 136a, a barrier layer 136b and a metal layer 136c sequentially stacked.

A hard mask layer 138 may be formed on the first metal layer structure 136.

Figure 18:
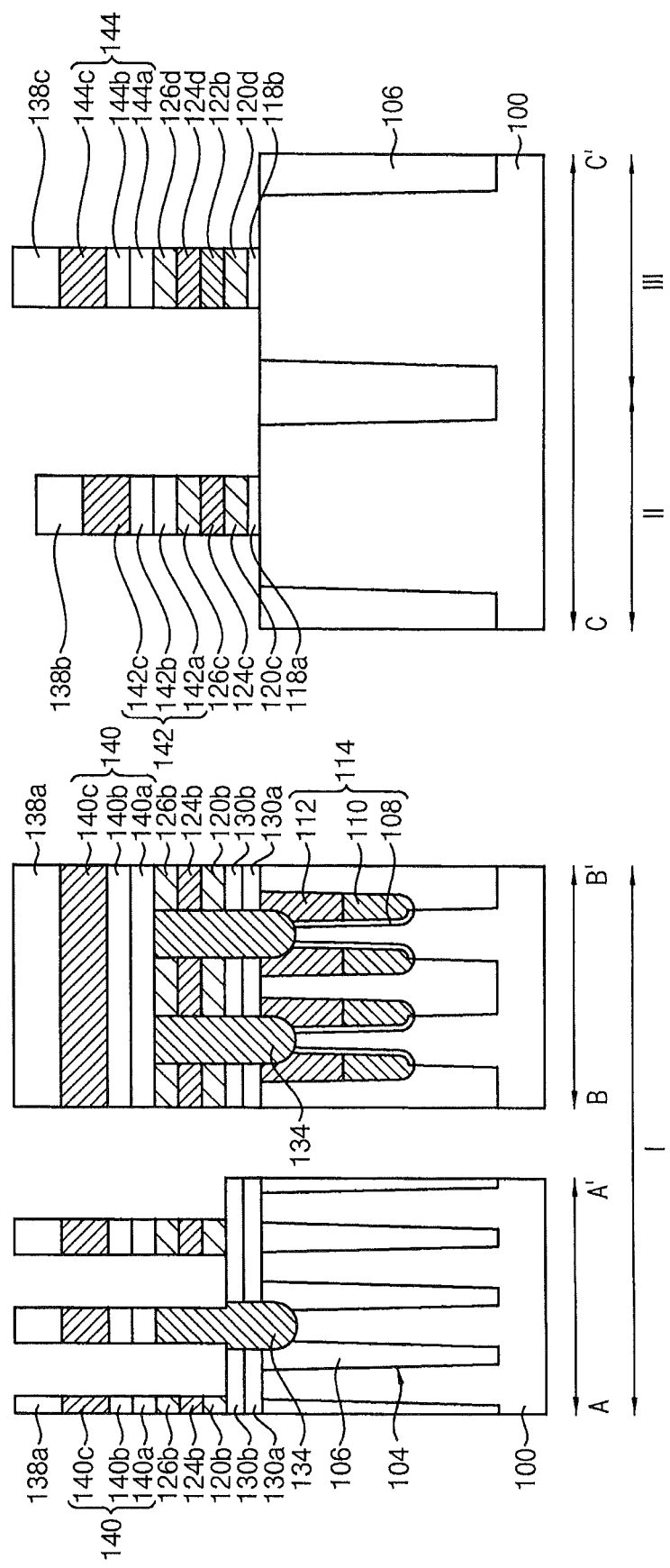

Referring to FIG. 18, the hard mask layer 138 may be partially etched to form first, second and third hard masks 138a, 138b and 138c. The first hard mask 138a may serve as an etch mask for forming a bit line 140 in the first region I. The second and third hard masks 138b and 138c may serve as etch masks for forming second and third gate structures in the second and third regions II and III, respectively.

The first metal layer structure 136, the preliminary adhesion layer pattern 126a, the preliminary n-type metal layer pattern 124a and the preliminary p-type metal layer pattern 122a may be sequentially etched using the first to third hard masks 138a, 138b and 138c as an etch mask. Additionally, the preliminary metal oxide layer pattern 120a and the first gate insulation layer 118 may be etched.

In the first region I, the preliminary metal oxide layer pattern 120a may be partially etched to form a metal oxide layer pattern 120b. An insulation layer structure may be formed to contact sidewalls of the contact plugs 134, which may include the first insulation layer pattern 130a and the second insulation layer pattern 130b sequentially stacked. The metal oxide layer pattern 120b may be formed on the insulation layer structure to contact the sidewalls of the contact plugs 134. The preliminary n-type metal layer pattern 124a and the preliminary adhesion layer pattern 126a may be partially etched to form a first n-type metal layer pattern 124b and a first adhesion layer pattern 126b, respectively, on the metal oxide layer pattern 120b. The first metal layer structure 136 may be partially etched to form a bit line 140 including a first ohmic layer pattern 140a, a first barrier layer pattern 140b and a first metal layer pattern 140c sequentially stacked.

In the second region II, the first metal layer structure 136, the preliminary adhesion layer pattern 126a, the preliminary n-type metal layer pattern 124a, the preliminary metal oxide layer 120a and the first gate insulation layer 118 may be partially etched to form a first upper metal layer pattern structure 142, a second adhesion layer pattern 126c, a second n-type metal layer pattern 124c, a second gate insulation layer pattern 120c and a first gate insulation layer pattern 118a, respectively. A first gate structure including the first gate insulation layer pattern 118a, the second gate insulation layer pattern 120c, the second n-type metal layer pattern 124c, the second adhesion layer pattern 126c, the first upper metal layer pattern structure 142 and the second hard mask 138b sequentially stacked may be defined.

The first gate structure may be substantially the same as a structure including the metal oxide layer pattern 120b, the first n-type metal layer pattern 124b, the first adhesion layer pattern 126b, the bit line 140 and the first hard mask 138a sequentially stacked in the first region I.

In the third region III, the first metal layer structure 136, the preliminary adhesion layer pattern 126a, the preliminary n-type metal layer pattern 124a, the preliminary p-type metal layer pattern 122a, the preliminary metal oxide layer 120a and the first gate insulation layer 118 may be partially etched to form a second upper metal layer pattern structure 144, a third adhesion layer pattern 126d, a third n-type metal layer pattern 124d, a first p-type metal layer pattern 122b, a fourth gate insulation layer pattern 120d and a third gate insulation layer pattern 118b, respectively. A second gate structure including the third gate insulation layer pattern 118b, the fourth gate insulation layer pattern 120d, the first p-type metal layer pattern 122b, the third n-type metal layer pattern 124d, the third adhesion layer pattern 126d, the second upper metal layer pattern structure 144 and the third hard mask 138c sequentially stacked may be defined.

The fourth gate insulation layer pattern 120d may be formed to include substantially the same material as that of the metal oxide layer pattern 120b in the bit line 140.

A structure of the third n-type metal layer pattern 124d, the third adhesion layer pattern 126d, the second upper metal layer pattern structure 144 and the third hard mask 138c may have substantially the same structure as a structure in the first region I including the metal oxide layer pattern 120b, the first n-type metal layer pattern 124b, the first adhesion layer pattern 126b, the bit line 140 and the first hard mask 138a sequentially stacked.

Figure 19:
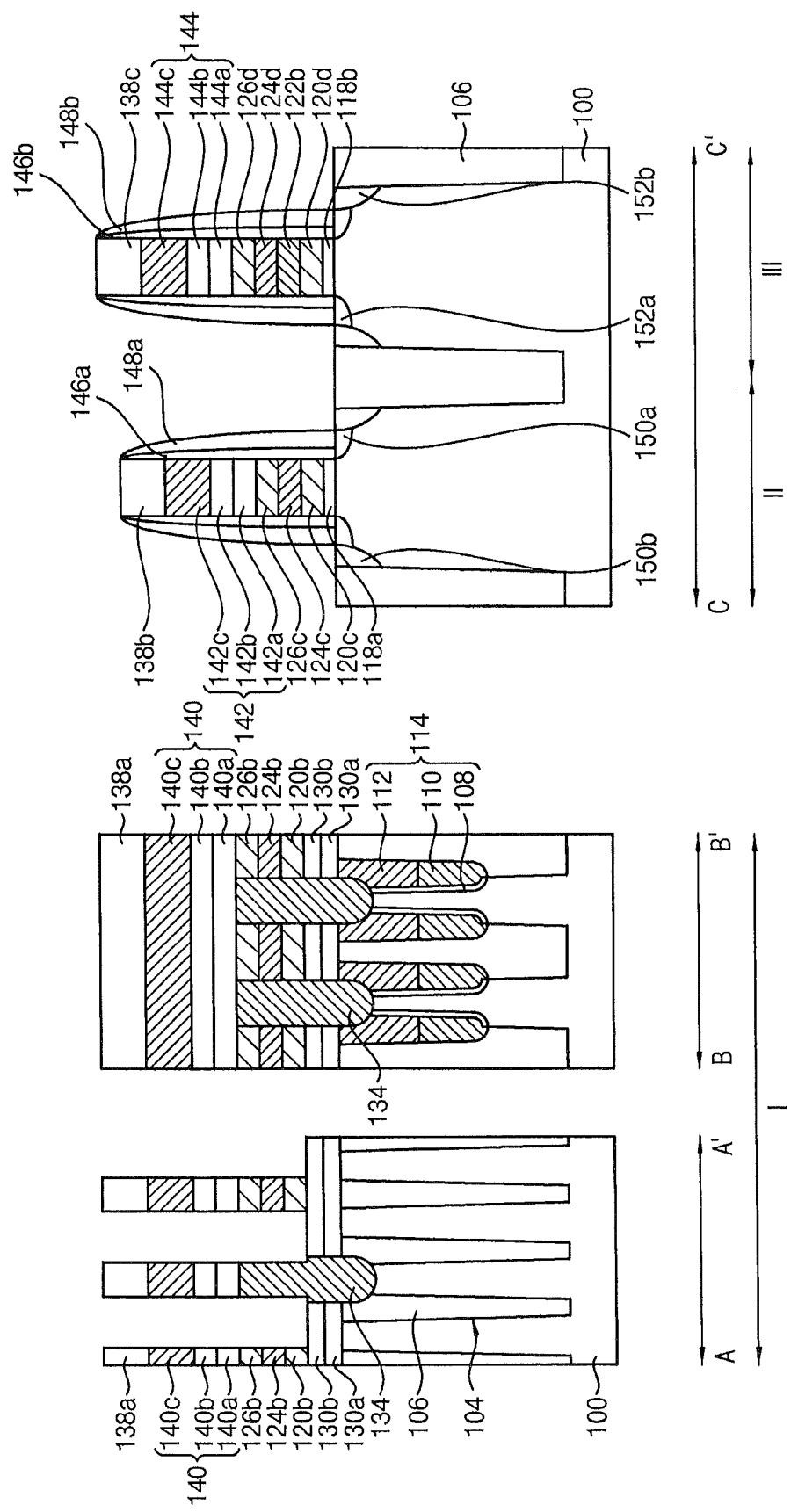

Referring to FIG. 19, first and second offset spacers 146a and 146b may be formed on sidewalls of the first and second gate structures in the second and third regions II and III, respectively.

N-type impurities may be implanted into a portion of the substrate 100 adjacent the first offset spacer 146a with a first impurity concentration. Thus, a first n-type impurity region 150a may be formed at an upper portion of the substrate 100 adjacent the first gate structure. P-type impurities may be implanted into a portion of the substrate 100 adjacent the second offset spacer 146a with a second impurity concentration. Thus, a first p-type impurity region 152a may be formed at an upper portion of the substrate 100 adjacent the second gate structure.

First and second main spacers 148a and 148b may be formed on the first and second offset spacers 146a and 146b, respectively. N-type impurities may be implanted into a portion of the substrate 100 adjacent the first main spacer 148a. Thus, a second n-type impurity region 150b may be formed at an upper portion of the substrate 100 adjacent the first n-type impurity region 150a, and an impurity concentration of the second n-type impurity region 150b may be higher than that of the first n-type impurity region 150a. P-type impurities may be implanted into a portion of the substrate 100 adjacent the second main spacer 148b. Thus, a second p-type impurity region 152b may be formed at an upper portion of the substrate 100 adjacent the first p-type impurity region 152a, and an impurity concentration of the second p-type impurity region 152b may be higher than that of the first p-type impurity region 152a. The second n-type and p-type impurity regions 150b and 152b may serve as source/drain regions.

An insulating interlayer (not shown) may be formed to cover the bit line 140 and the first and second gate structures. The insulating interlayer may be partially etched, and the first and second insulation layer patterns 130a and 130b may be partially etched to form storage node contact holes (not shown) exposing the second and third contact regions of the substrate 100. A conductive layer (not shown) may be formed to fill the storage node contact holes, and the conductive layer may be planarized to form storage node contacts (not shown). A capacitor (not shown) may be formed on the storage node contacts, so that a DRAM device may be manufactured.

In the semiconductor device, the structures of the bit line 140 and the first and second gate structures may be modified.

Figure 20:
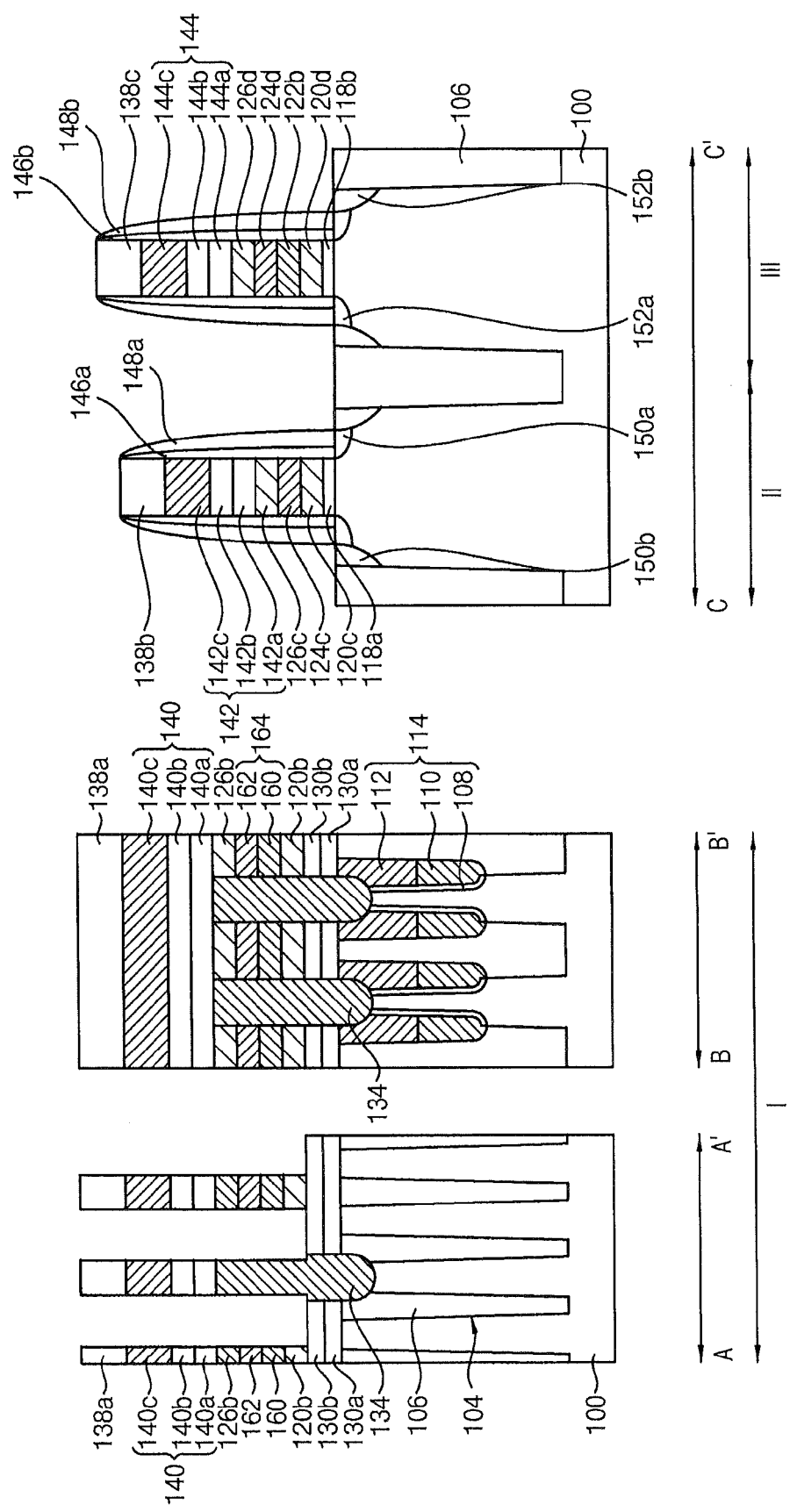
FIG. 20 is a cross-sectional view of a semiconductor device in accordance with some embodiments of the present inventive concept.

FIG. 20 is a cross-sectional view of a semiconductor device in accordance with some embodiments of the present inventive concept. The semiconductor device may be substantially the same as or similar to that illustrated in FIGS. 6 and 7, except for a structure of a bit line. NMOS and PMOS transistors in FIG. 20 may be substantially the same as or similar to those in FIGS. 6 and 7. Thus, like reference numerals refer to like elements, and detailed descriptions are omitted herein.

Referring to FIG. 20, a substrate 100 may have first, second and third regions I, II and III. The substrate 100 may be divided into an active region and an isolation region. A buried gate structure 114 may be formed in the first region I of the substrate 100. Contact plugs 134 may be formed on a first contact region of the substrate 100 in the first region I.

An insulation layer structure may be formed on the substrate 100 between the contact plugs 134, which may include at least one insulation layer pattern. In some embodiments, the insulation layer structure may include first insulation layer pattern 130a and a second insulation layer pattern 130b sequentially stacked. A metal oxide layer pattern 120b may be formed on the insulation layer structure between the contact plugs 134.

A top surface of the metal oxide layer pattern 120b may be lower than that of the contact plug 134. The metal oxide layer pattern 120b may include a dielectric material having a dielectric constant substantially higher than that of silicon oxide. The metal oxide layer pattern 120b may include substantially the same material as those of second and fourth gate insulation layer patterns 120c and 120d in the second and third regions II and III, respectively.

A first metal layer pattern 164 may be formed on the metal oxide layer pattern 120b between the contact plugs 134. The first metal layer pattern 164 may contact sidewalls of the contact plugs 134. Bottom surfaces of the first metal layer pattern 164 may be lower than top surfaces of the contact plugs 134. The first metal layer pattern 164 may have a structure substantially the same as that of a gate electrode of a transistor in the second region II or a gate electrode of a transistor in the third region III.

In some embodiments, the first metal layer pattern 164 may have a structure substantially the same as that of the gate electrode of the transistor in the third region III. The first metal layer pattern 164 may include a layer containing a first metal for forming a gate electrode of an NMOS transistor in the second region II and a layer containing a second metal for forming a gate electrode of a PMOS transistor in the third region III. Hereinafter, the layers including the first and second metals may be referred as a first n-type metal layer pattern 162 and a first p-type metal layer pattern 160, respectively, and the first metal layer pattern 164 may have the first p-type metal layer pattern 160 and the first n-type metal layer pattern 162 sequentially stacked.

A first adhesion layer pattern 126b may be formed on the first n-type metal layer pattern 162 between the contact plugs 134. The first adhesion layer pattern 126b may include a semiconductor material doped with impurities, e.g., doped polysilicon. Some embodiments provide that the first adhesion layer pattern 126b may not be formed.

A bit line 140 may be formed on top surfaces of the contact plugs 134 and the first adhesion layer pattern 126b. The bit line 140 may include, e.g., a metal. The bit line 140 may have a structure in which a first ohmic layer pattern 140a, a first barrier layer pattern 140b and a first metal layer pattern 140c are sequentially stacked. The bit line 140 may extend in the third direction. The bit line 140 may be substantially the same as or similar to that of FIGS. 6 and 7.

The NMOS and PMOS transistors may be formed in the second and third regions II and III, respectively. The NMOS and PMOS transistors may be substantially the same as or similar to those of FIGS. 6 and 7.

In some embodiments, the semiconductor device may include the first metal layer pattern 164 contacting the bit line 140, and thus a resistance of the bit line 140 may be decreased. In addition, a height of the bit line 140 may be reduced so that a parasitic capacitance therebetween may be decreased.

Figure 21:
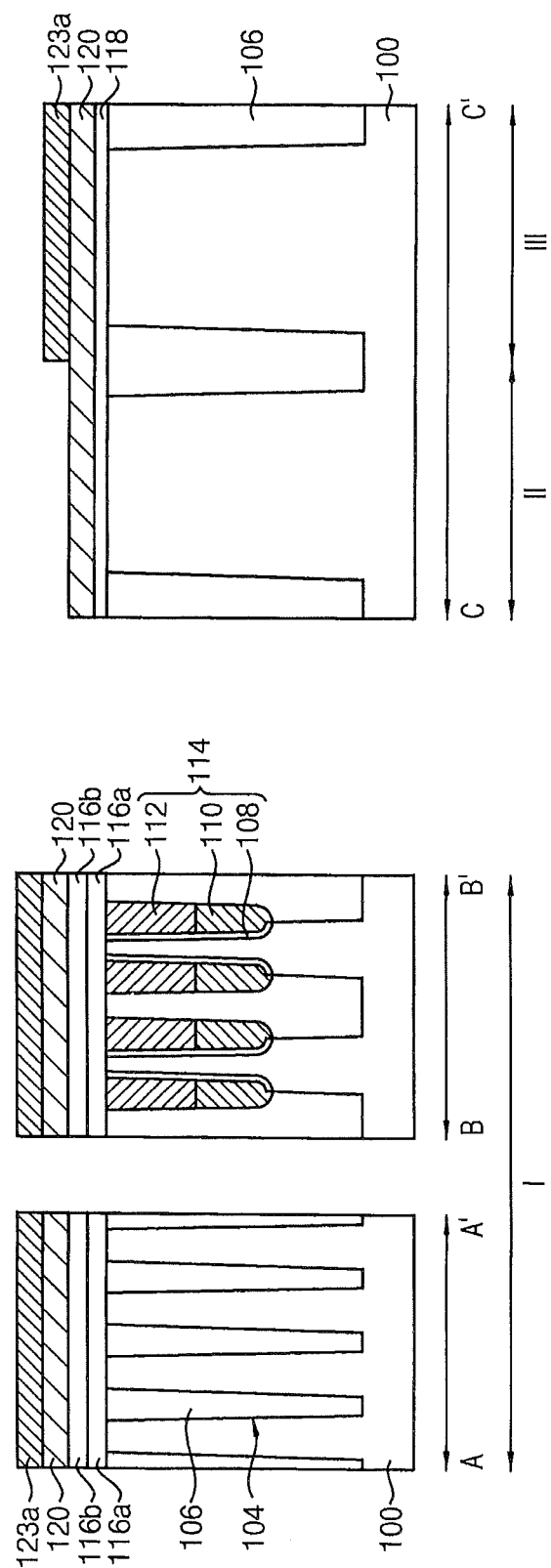
FIGS. 21 to 22 are cross-sectional views illustrating stages of methods of manufacturing the semiconductor device in FIG. 20.
Figure 22:
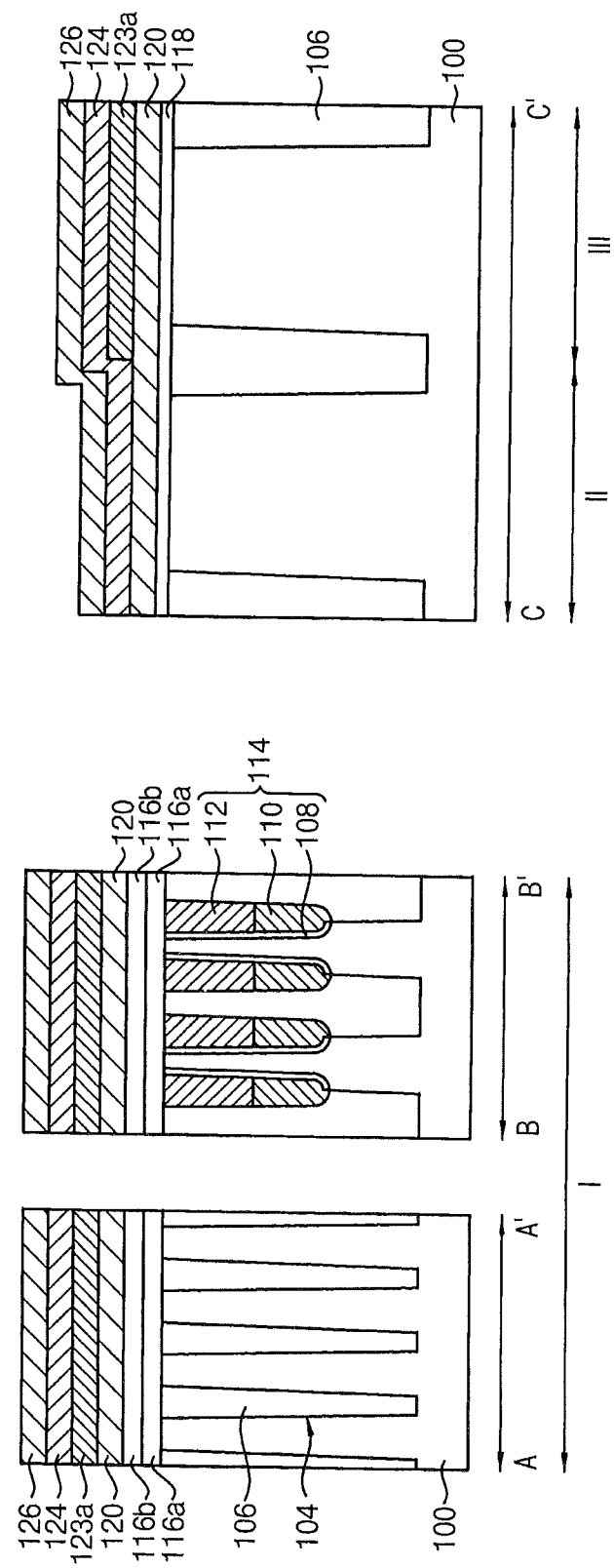

FIGS. 21 to 22 are cross-sectional views illustrating stages of methods of manufacturing the semiconductor device of FIG. 20.

Processes substantially the same as or similar to those illustrated with reference to FIGS. 9 to 12 may be performed to form the semiconductor device in FIG. 12.

Referring to FIG. 21, an etch mask (not shown), e.g., a photoresist pattern may be formed on a p-type metal layer 122, which may cover portions of the substrate 100 in first and third regions I and III. A portion of the p-type metal layer 122 in a second region II may be etched using the etch mask to form a preliminary p-type metal layer pattern 123a in the first and third regions I and III. The etching process may be performed by a wet etch process or a dry etch process.

By the etching process, a portion of the metal oxide layer 120 in the second region II may be exposed.

Referring to FIG. 22, an n-type metal layer 124 may be formed on the metal oxide layer 120 in the second region II and the preliminary p-type metal layer pattern 123a in the first and third regions I and III. The n-type metal layer 124 may include a first metal having a proper work function for a gate electrode of an NMOS transistor.

The preliminary p-type metal layer pattern 123a and the n-type metal layer 124 may be sequentially stacked on the metal oxide layer 120 in the first and third regions I and III.

An adhesion layer 126 may be formed on the n-type metal layer 124. In some embodiments, the adhesion layer 126 may not be formed.

Processes substantially the same as or similar to those illustrated with reference to FIGS. 15 to 19 may be performed to manufacture the semiconductor device of FIG. 20.

Figure 23:
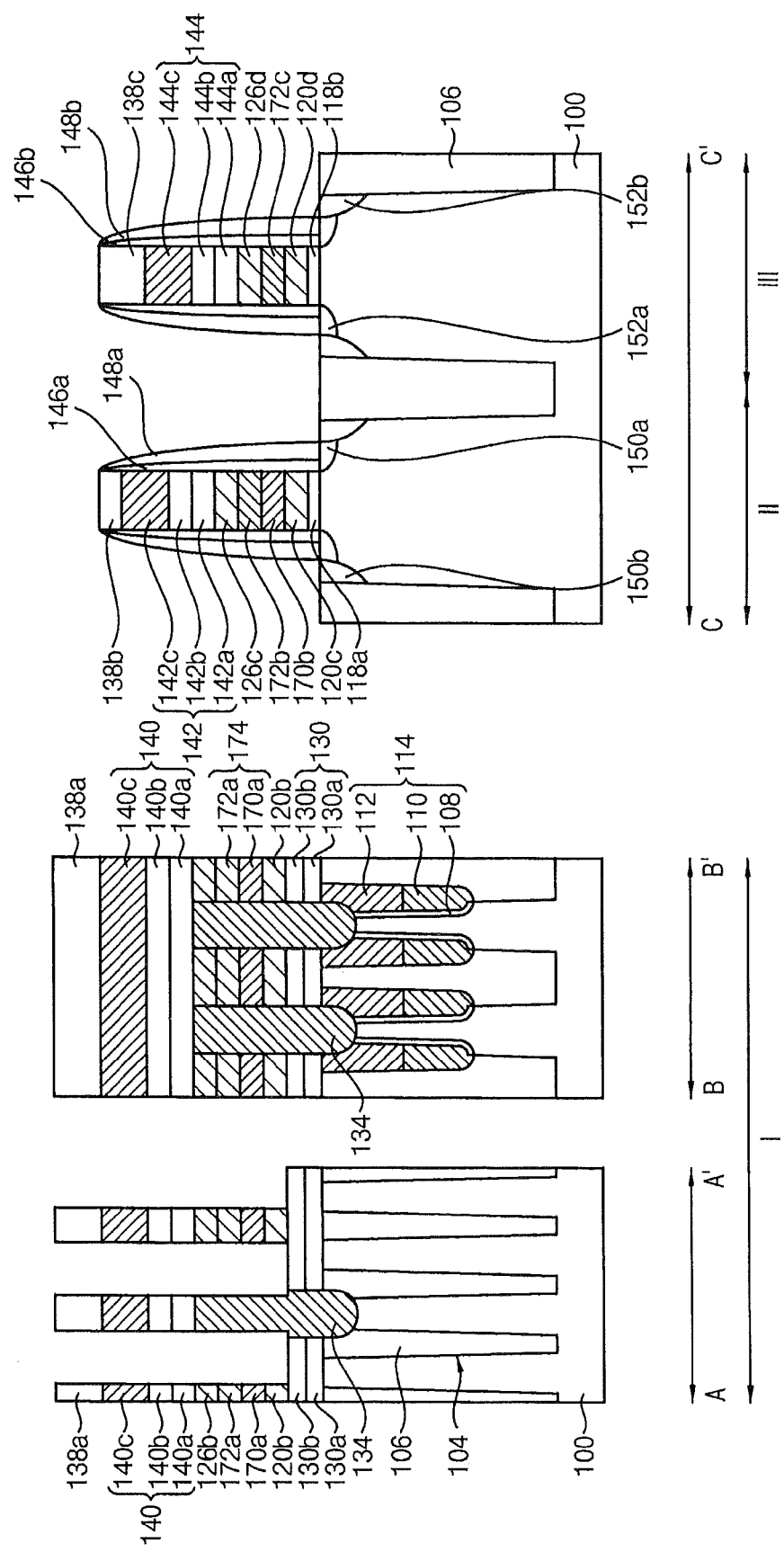
FIG. 23 is a cross-sectional view of a semiconductor device in accordance with some embodiments of the present inventive concept.

FIG. 23 is a cross-sectional view of a semiconductor device in accordance with some embodiments of the present inventive concept.

The semiconductor device may be substantially the same as or similar to that illustrated in FIGS. 6 and 7, except for the structure of the bit line in the first region I of and the gate structures in the second and third regions II and III. Thus, like reference numerals refer to like elements, and detailed descriptions are omitted herein.

Referring to FIG. 23, a substrate 100 may have first, second and third regions I, II and III. The substrate 100 may be divided into an active region and an isolation region. A buried gate structure 114 may be formed in the first region I of the substrate 100. Contact plugs 134 may be formed on a first contact region of the substrate 100 in the first region I.

An insulation layer structure 130 may be formed on the substrate 100 between the contact plugs 134, which may include at least one insulation layer pattern. In some embodiments, the insulation layer structure 130 may include first and second insulation layer patterns 130a and 130b sequentially stacked. A metal oxide layer pattern 120b may be formed on the insulation layer structure 130 between the contact plugs 134. The metal oxide layer pattern 120b may include substantially the same metal oxide as that of the second and fourth gate insulation layer patterns 120c and 120d in the second and third regions II and III, respectively.

A first metal layer pattern 174 may be formed on the metal oxide layer pattern 120b between the contact plugs 134. The first metal layer pattern 174 may contact sidewalls of the contact plugs 134. Bottom surfaces of the first metal layer pattern 174 may be lower than top surfaces of the contact plugs 134. The first metal layer pattern 174 may have a structure substantially the same as one of gate electrodes of transistors in the second and third regions II and III.

In some embodiments, the first metal layer pattern 174 may have a structure substantially the same as that of a gate electrode of the transistor in the second region II. The first metal layer pattern 174 may include a first metal for forming a gate electrode of an NMOS transistor or a second metal for forming a gate electrode of a PMOS transistor. In some embodiments, the first metal layer pattern 174 may include a first n-type metal layer pattern 170a and a first p-type metal layer pattern 172a sequentially stacked.

A first adhesion layer pattern 126b may be formed on the first p-type metal layer pattern 172a between the contact plugs 134. The first adhesion layer pattern 126b may include a semiconductor material doped with impurities, e.g., doped polysilicon. Some embodiments provide that the first adhesion layer pattern 126b may not be formed.

A bit line 140 may be formed on top surfaces of the contact plugs 134 and the first adhesion layer pattern 126b. The bit line 140 may include, e.g., a metal. The bit line 140 may have a structure in which a first ohmic layer pattern 140a, a first barrier layer pattern 140b and a first metal layer pattern 140c are sequentially stacked. The bit line 140 may extend in the third direction. The bit line 140 may be substantially the same as or similar to that of FIGS. 6 and 7.

The NMOS and PMOS transistors may be formed in the second and third regions II and III, respectively.

The NMOS transistor may include a first gate structure in which a first gate insulation layer pattern 118a, a second gate insulation layer pattern 120c, a second n-type metal layer pattern 170b, a second p-type metal layer pattern 172b, a second adhesion layer pattern 126c, a first upper metal layer pattern structure 142 and a second hard mask 138b are sequentially stacked on the substrate 100. The NMOS transistor may include n-type impurity regions 150a and 150b at upper portions of the substrate 100 adjacent the first gate structure. The NMOS transistor may further include first spacers 146a and 148a on a sidewall of the first gate structure.

The first gate insulation layer pattern 118a may include silicon oxide that may be formed by an oxidation process on a top surface of the substrate 100.

The second gate insulation layer pattern 120c may include a metal oxide having a dielectric constant higher than that of silicon oxide. The second gate insulation layer pattern 120c may include substantially the same material as the metal oxide layer pattern 120b in the first region I.

The second n-type metal layer pattern 170b may include a first metal having a proper work function for the gate electrode of the NMOS transistor. The second n-type metal layer pattern 170b may include substantially the same material as the first n-type metal layer pattern 170a in the first region I. The second p-type metal layer pattern 172b may include a second metal. The second metal may have a proper work function for the gate electrode of the PMOS transistor. The second p-type metal layer pattern 172b may include substantially the same material as that of the first p-type metal layer pattern 172a in the first region I.

The first upper metal layer pattern structure 142 may include substantially the same material at that of the bit line 140, and may have a structure substantially the same as that of the bit line 140. The second hard mask 138b may include a material substantially the same as that of the first hard mask 138a in the first region I.

The PMOS transistor may include a second gate structure in which a third gate insulation layer pattern 118b, a fourth gate insulation layer pattern 120d, a third p-type metal layer pattern 172c, a third adhesion layer pattern 126d, a second upper metal layer pattern structure 144 and a third hard mask 138c are sequentially stacked on the substrate 100. The PMOS transistor may include n-type impurity regions 152a and 152b at upper portions of the substrate 100 adjacent the first gate structure. The PMOS transistor may further include second spacers 146b and 148b on a sidewall of the second gate structure.

The third gate insulation layer pattern 118b may include a material substantially the same as that of the first gate insulation layer pattern 118a. The fourth gate insulation layer pattern 120d may include a material substantially the same as that of the second gate insulation layer pattern 120c.

The third p-type metal layer pattern 172c may include the second metal. The second metal may be substantially the same as those of the first and second p-type metal layer patterns 172a and 172b.

The second upper metal layer pattern structure 144 may have a structure substantially the same as that of the bit line 140 in the first region I. The third hard mask 138c may include a material substantially the same as that of the first and second hard masks 138a and 138b.

Figure 24:
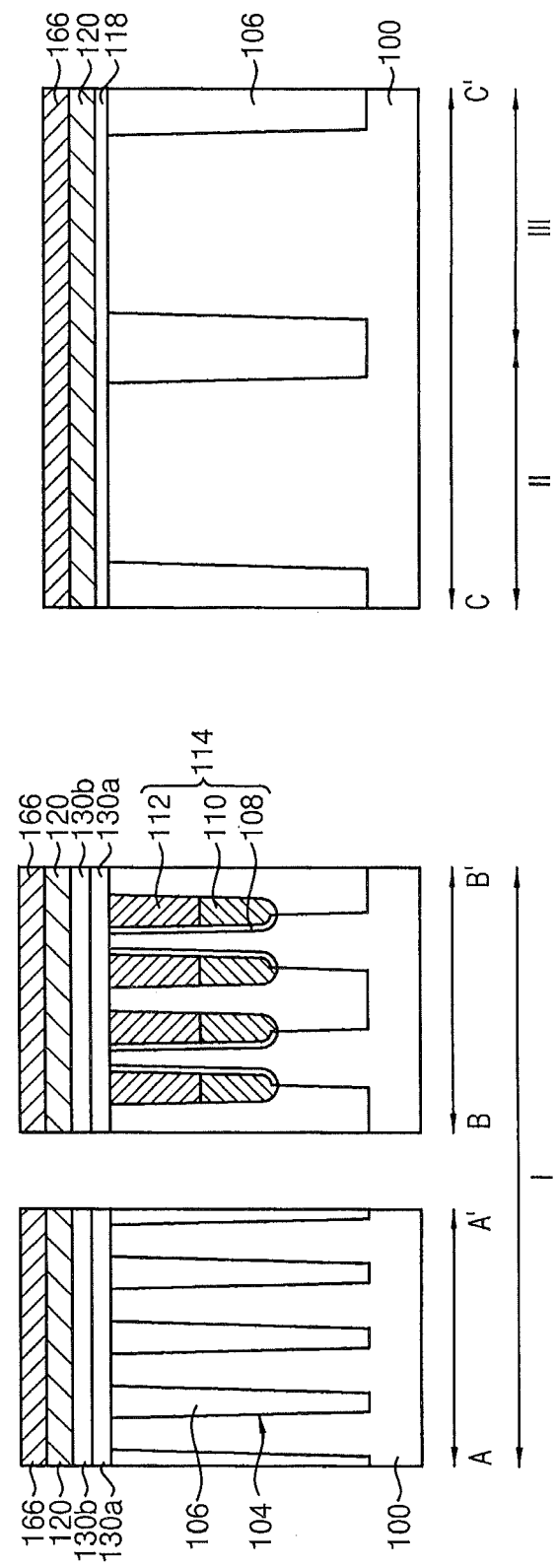
FIGS. 24 to 26 are cross-sectional views illustrating stages of methods of manufacturing the semiconductor device in FIG. 23.
Figure 25:
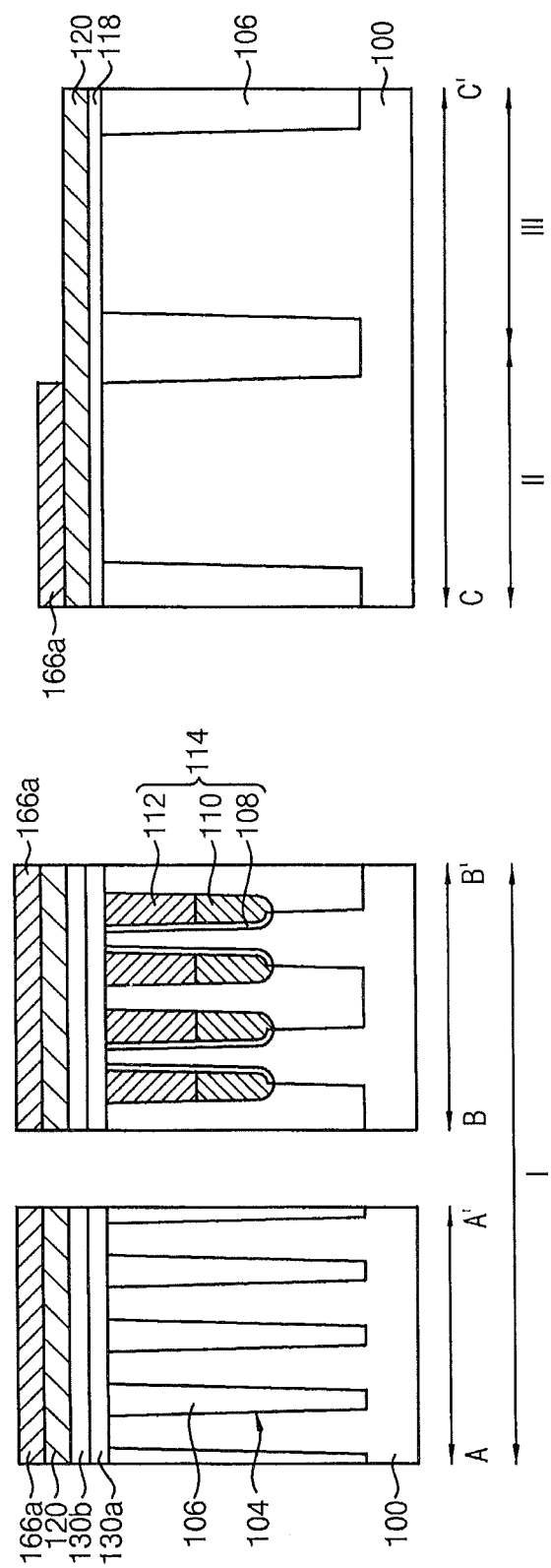
Figure 26:
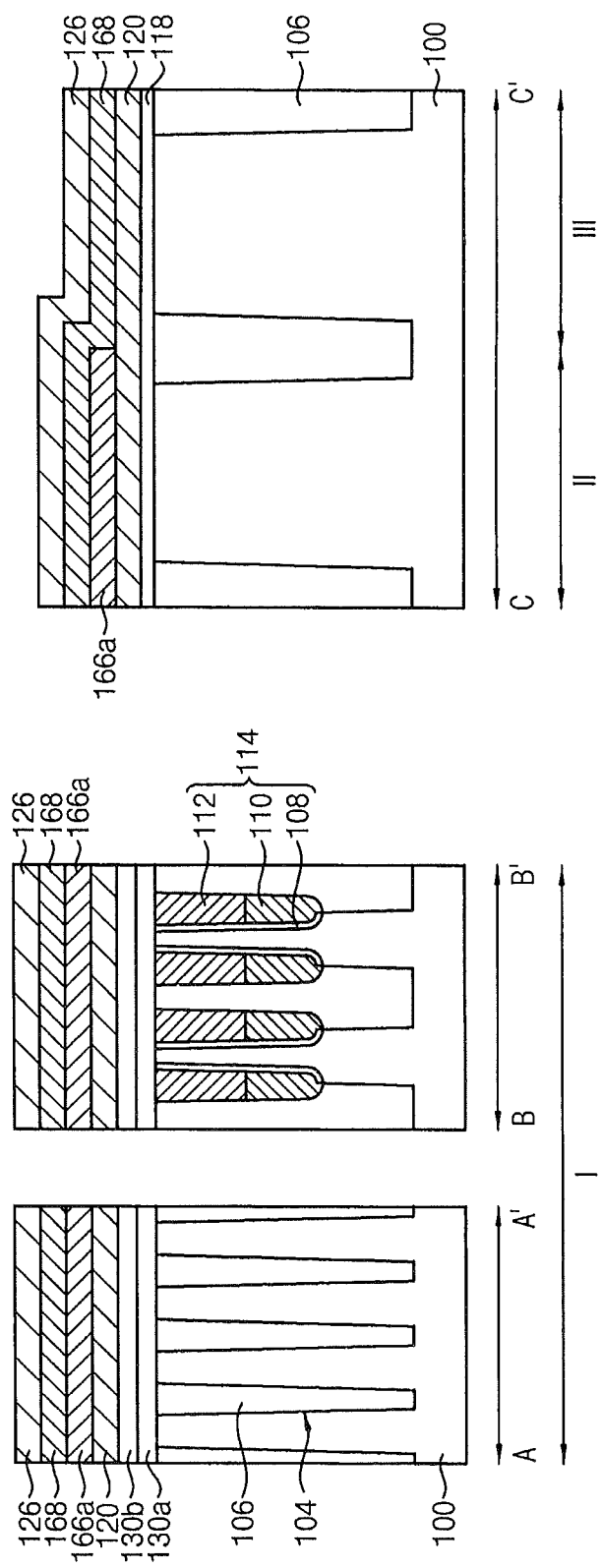

FIGS. 24 to 26 are cross-sectional views illustrating stages of methods of manufacturing the semiconductor device in FIG. 23.

Processes substantially the same as or similar to those illustrated with reference to FIGS. 9 to 11 may be performed to form the semiconductor device of FIG. 11.

Referring to FIG. 24, an n-type metal layer 166 may be formed on a metal oxide layer 120.

Referring to FIG. 25, an etch mask (not shown), e.g., a photoresist pattern may be formed to cover portions of the n-type metal layer 166 in first and second regions I and II of a substrate 100. A portion of the n-type metal layer 166 in a third region III may be removed using the etch mask to form a preliminary n-type gate metal layer pattern 166a. The etching process may be performed by a wet etch process and/or a dry etch process.

By the etching process, a portion of the metal oxide layer 120 in the third region III may be exposed.

Referring to FIG. 26, a p-type metal layer 168 may be formed on the metal oxide layer 120 and the preliminary n-type gate metal layer pattern 166a. The p-type metal layer 168 may include a second metal having a proper work function for a gate electrode of a PMOS transistor.

The p-type metal layer 168 may be formed on the metal oxide layer 120 in the third region III. The preliminary n-type metal layer pattern 166a and the p-type metal layer 168 may be sequentially stacked on the metal oxide layer 120 in the first and second regions I and II.

An adhesion layer 126 may be formed on the p-type metal layer 168. Some embodiments provide that the adhesion layer 126 may not be formed.

Processes substantially the same as or similar to those illustrated with reference to FIGS. 15 to 19 may be performed to manufacture the semiconductor device of FIG. 23.

Figure 27:
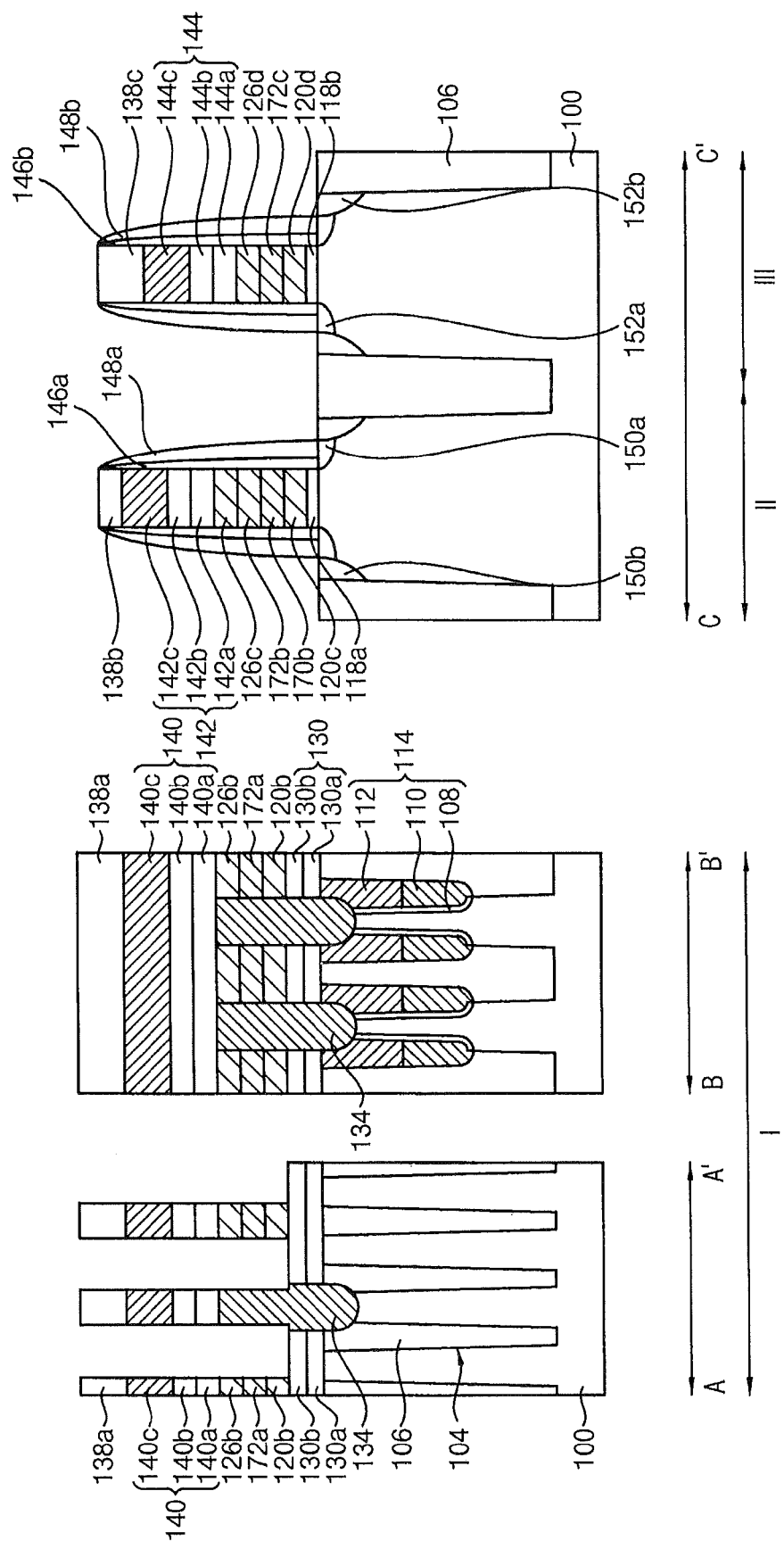
FIG. 27 is a cross-sectional view of a semiconductor device in accordance with some embodiments of the present inventive concept.

FIG. 27 is a cross-sectional view of a semiconductor device in accordance with some embodiments of the present inventive concept.

The semiconductor device may be substantially the same as or similar to that illustrated in FIG. 23, except for the structure of the bit line in the first region I. NMOS and PMOS transistors in the second and third regions II and III may be substantially the same as or similar to those of FIG. 23. Thus, like reference numerals refer to like elements, and detailed descriptions are omitted herein.

Referring to FIG. 27, a substrate 100 may have first, second and third regions I, II and III. The substrate 100 may be divided into an active region and an isolation region. A buried gate transistor 114 may be formed in the first region I of the substrate 100. Contact plugs 134 may be formed on a first contact region of the substrate 100 in the first region I.

An insulation layer structure 130 may be formed on the substrate 100 between the contact plugs 134, which may include at least one insulation layer pattern. In some embodiments, the insulation layer structure 130 may include first and second insulation layer patterns 130a and 130b sequentially stacked. A metal oxide layer pattern 120b may be formed on the insulation layer structure 130 between the contact plugs 134.

A first p-type metal layer pattern 172a may be formed on the metal oxide layer pattern 120b between the contact plugs 134.

In some embodiments, the first p-type metal layer pattern 172a may be substantially the same as a gate electrode of a PMOS transistor in the third region III. The first p-type metal layer pattern 172a may include a second metal for a gate electrode of the PMOS transistor, which may have a proper work function for the gate electrode of the PMOS transistor.

A first adhesion layer pattern 126b may be formed on the first p-type metal layer pattern 172a between the contact plugs 134.

A bit line 140 may be formed on top surfaces of the contact plugs 134 and the first adhesion layer pattern 126b. The bit line 140 may include, e.g., a metal.

The NMOS and PMOS transistors may be formed in the second and third regions II and III, respectively. The NMOS and PMOS transistors in second and third regions II and III may be substantially the same as or similar to those of FIG. 23.

In some embodiments, the semiconductor device may include the first p-type metal layer pattern 172a contacting the bit line 140, and thus a resistance of the bit line 140 may be decreased. In addition, a height of the bit line 140 may be reduced so that a parasitic capacitance therebetween may be decreased.

Figure 28:
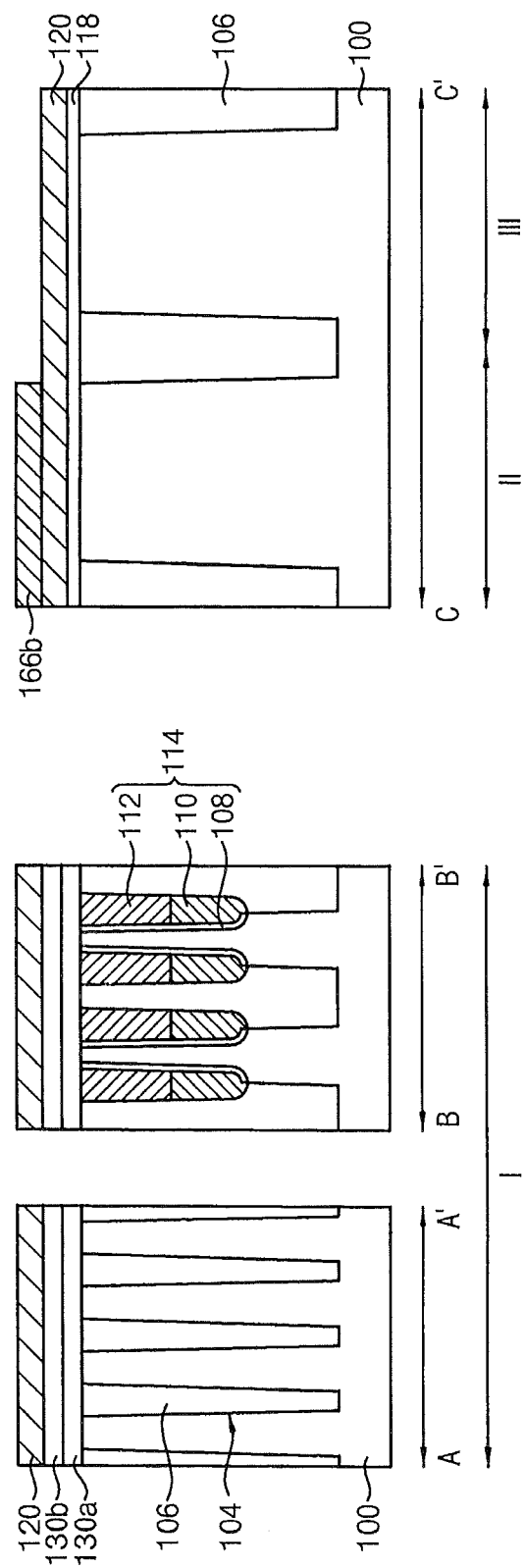
FIG. 28 is a cross-sectional view illustrating methods of manufacturing the semiconductor device in accordance with some embodiments of the present inventive concept.

FIG. 28 is a cross-sectional view illustrating a stage of methods of manufacturing the semiconductor device of FIG. 27.

Processes substantially the same as or similar to those illustrated with reference to FIGS. 9 to 11 may be performed to form the semiconductor device of FIG. 11.

Referring to FIG. 28, an n-type metal layer may be formed on a metal oxide layer 166. An etch mask (not shown), e.g., a photoresist pattern may be formed to cover a portion of the n-type metal layer in the second region II. Portions of the n-type metal layer in the first and third regions I and III may be removed using the etch mask to form a preliminary n-type metal layer pattern 166b. The etching process may be performed by a wet etch process or a dry etch process.

By the etching process, portions of the metal oxide layer 120 in the first and third regions I and III may be exposed.

Processes substantially the same as or similar to those illustrated with reference to FIGS. 15 to 19 and 26 may be performed to manufacture the semiconductor device of FIG. 27.

Figure 29:
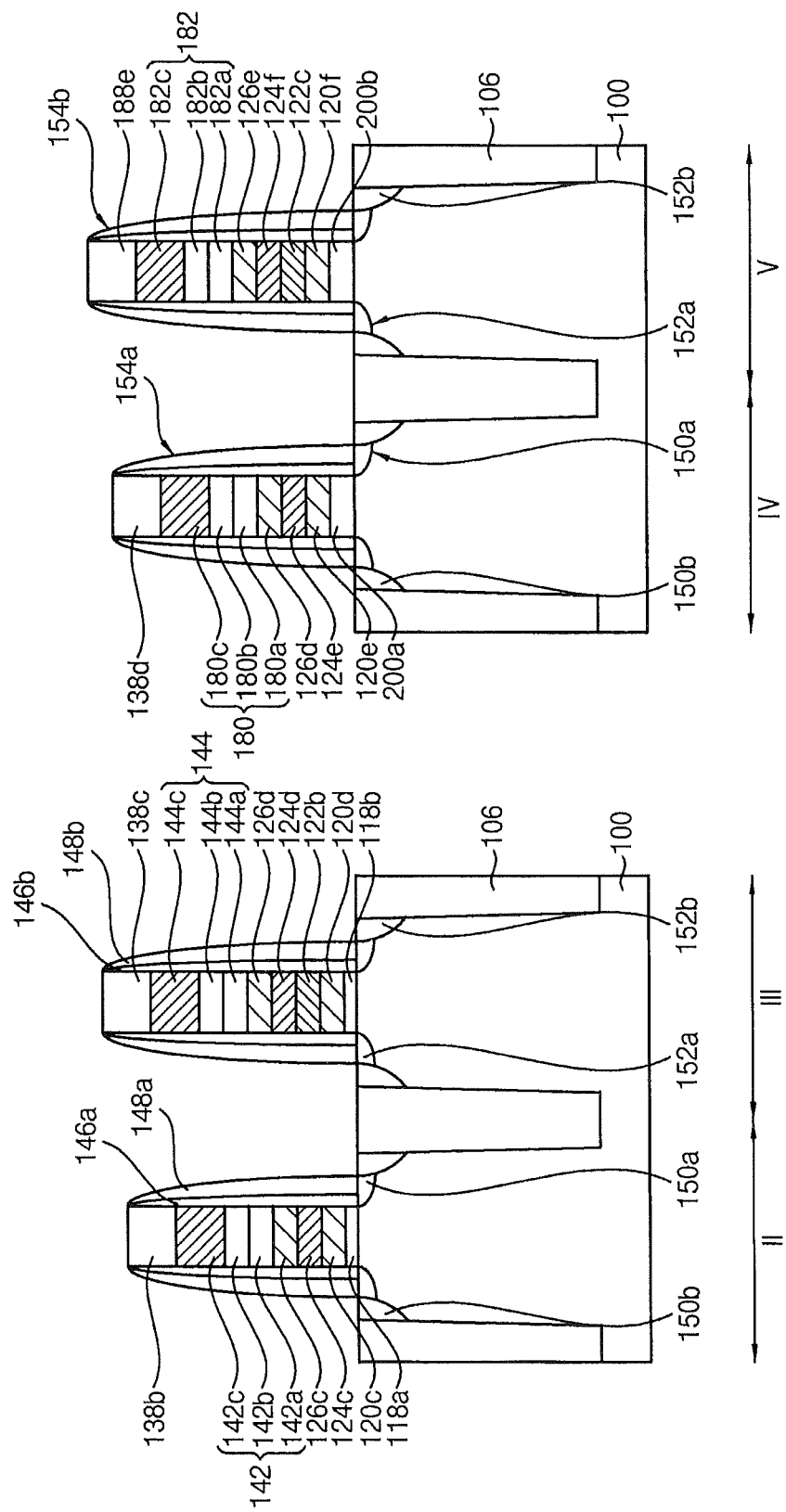
FIG. 29 is a cross-sectional view of a semiconductor device in accordance with some embodiments of the present inventive concept.

FIG. 29 is a cross-sectional view of a semiconductor device in accordance with some embodiments of the present inventive concept.

The semiconductor device may include memory cells (not shown) in a memory cell region (not shown) corresponding to the first region I in FIGS. 6 and 7, and a first NMOS transistor and a first PMOS transistor in a peripheral circuit region corresponding to the NMOS transistor and the PMOS transistor in the second and third regions II and III in FIGS. 6 and 7. Further, the semiconductor device may include a second NMOS transistor and a second PMOS transistor in fourth and fifth regions IV and V, respectively, to supply a high operation voltage to the peripheral circuit region. The second to fifth regions II, III, IV and V may define the peripheral circuit region.

Referring to FIG. 29, the second NMOS transistor may include a third gate structure in which a fifth gate insulation layer pattern 200a, a sixth gate insulation layer pattern 120e, a fourth n-type metal layer pattern 124e, a third adhesion layer pattern 126d, a third upper metal layer pattern structure 180, and a fourth hard mask 138d are sequentially stacked on the substrate 100. The second NMOS transistor may further include a third spacer 154a on a sidewall of the third gate structure. A second n-type impurity region 150a may be formed at an upper portion of the substrate 100 adjacent the third gate structure.

The fifth gate insulation layer pattern 200a may have a thickness greater than that of the first gate insulation layer pattern 118a. The second NMOS transistor may have an operation voltage higher than that of the first NMOS transistor. The fifth gate insulation layer pattern 200a may include at least a material substantially the same as that of an insulation layer structure in the first region I. For example, the fifth gate insulation layer pattern 200a may include a material substantially the same as that of the first insulation layer pattern 130a in the first region I. The sixth insulation layer pattern 120e may include a material substantially the same as that of a second gate insulation layer pattern 120c.

The fourth n-type metal layer pattern 124e, the third adhesion layer pattern 126d and the third upper metal layer pattern structure 180 may serve as a third gate electrode of the third gate structure. The third gate electrode may be substantially the same as that of a gate electrode of the first NMOS transistor.

The second PMOS transistor may include a fourth gate structure in which a seventh gate insulation layer pattern 200b, an eighth gate insulation layer pattern 120f, a second p-type metal layer pattern 122c, a fifth n-type metal layer pattern 124f, a fourth adhesion layer pattern 126e, a fourth upper metal layer pattern structure 182 and a fifth hard mask 138e are sequentially stacked on the substrate 100. The second PMOS transistor may further include a fourth spacer 154b on a sidewall of the fourth gate structure. A second p-type impurity region 156b may be formed at an upper portion of the substrate 100 adjacent the fourth gate structure.

The seventh gate insulation layer pattern 200b may have a thickness greater than that of the third gate insulation layer pattern 118b. The second PMOS transistor may have an operation voltage higher than that of the first PMOS transistor. The seventh gate insulation layer pattern 200b may include at least a material substantially the same as that of the insulation layer structure in the first region I. For example, the seventh gate insulation layer pattern 200b may include a material substantially the same as the first insulation layer pattern 130a in the first region I. The eighth insulation layer pattern 120f may include a material substantially the same as that of the fourth gate insulation layer pattern 120d.

The second p-type metal layer pattern 122c, the fifth n-type metal layer pattern 124f, the fifth adhesion layer pattern 126f and the fourth upper metal layer pattern structure 182 may serve as a second gate electrode. The second gate electrode may be substantially the same as that of a gate electrode of the first PMOS transistor.

Some embodiments provide that the MOS transistors may have different operation voltages to each other.

Hereinafter, methods of manufacturing the semiconductor device in FIG. 29 will be described.

A substrate 100 having the first region (not shown) serving as a memory cell region and a peripheral circuit region may be provided. The peripheral circuit region may include second, third, fourth and fifth regions II, III, IV and V. First and second NMOS transistors may be formed in the second and fourth regions II and IV, respectively. First and second PMOS transistors may be formed in the third and fifth regions III and V, respectively.

Processes substantially the same as or similar to those illustrate with reference to FIGS. 9 and 10 may be performed. A first insulation layer and a second insulation layer may be sequentially formed on the substrate 100. The first insulation layer may include a material different from that of the second insulation layer.

An etch mask (not shown), e.g., a photoresist pattern may be formed on the second insulation layer in the first, fourth and fifth regions I, IV and V of the substrate 100. Portions of the first and second insulation layers in the first, fourth and fifth regions I, IV and V may be removed using the etch mask to form first and second preliminary insulation layers, respectively.

By the etch process, portions of the substrate 100 in the second and third regions II and III may be exposed.

Processes substantially the same as or similar to those with reference to FIGS. 12 to 17 may be performed.

A patterning process may be performed to form a bit line (not shown) in the first region I, and to form first, second, third and fourth gate structures in the second, third, fourth and fifth regions II, III, IV and V, respectively. Therefore, the semiconductor device of FIG. 29 may be manufactured.

The semiconductor device in accordance with the some embodiments of the present inventive concept may be applied in various types of semiconductor packages. The semiconductor device and the semiconductor package including the same may be applied in various types of systems, e.g., a computer system.

Figure 30:
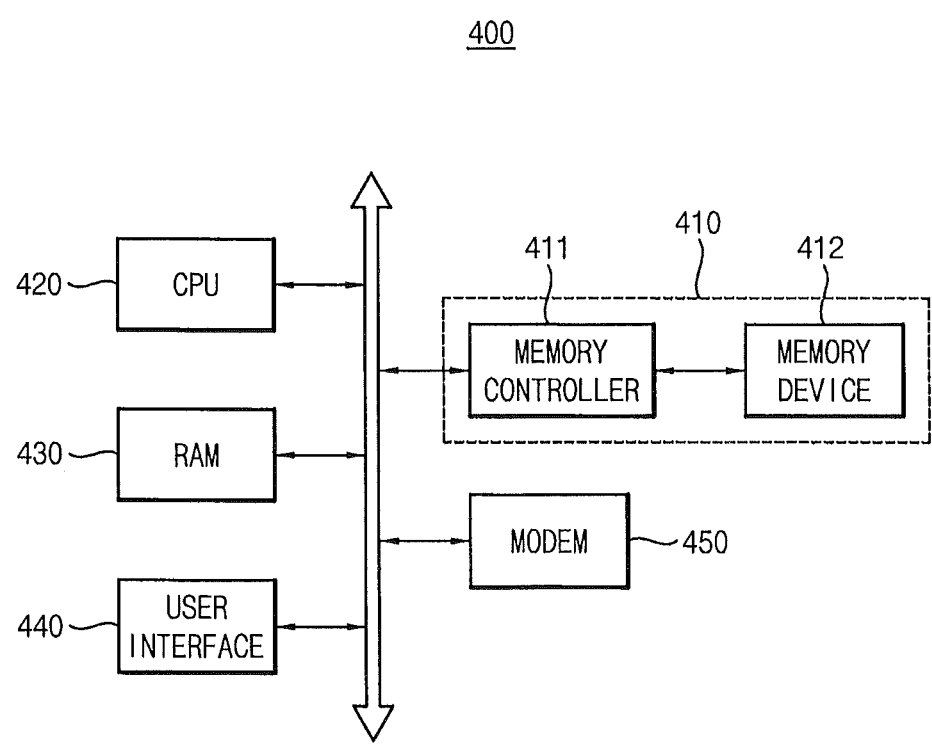
FIG. 30 is a block diagram illustrating a computer system in accordance with some embodiments of the present inventive concept.

Referring to FIG. 30, a computer system 400 may include a CPU 420 electrically connected to a system bus, a RAM 430, a user interface 440, a modem 450 and a memory system 410. The memory system 410 may include a memory device 412 and a memory controller 411. The memory device 412 may include a DRAM device in accordance with the some embodiments of the present inventive concept. The memory system 410 including the memory device 412 and the memory controller 411 may serve as a memory card or a solid state disk (SSD). When the computer system 400 is a mobile device, a battery of the mobile device may be provided to supply an operating voltage of the computer system 400. The computer system 400 in accordance with the some embodiments of the present inventive concept may further include an application chipset, a camera image processor (CIS), a mobile DRAM, etc.

The foregoing is illustrative of some example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   a substrate including a first region and a second region;
   a plurality of contact plugs contacting the substrate in the first region;
   an insulation layer pattern on the substrate in the first region between ones of the plurality of contact plugs, the insulation layer pattern having a top surface that is lower than top surfaces of ones of the plurality of contact plugs relative to the substrate;
   a first metal oxide layer pattern on the insulation layer pattern, the first metal oxide layer pattern having a dielectric constant that is higher than that of silicon oxide;
   a first metal pattern on the first metal oxide layer pattern, the first metal pattern contacting sidewalls of the plurality of contact plugs;
   a metal line contacting top surfaces of the plurality of contact plugs and the first metal pattern; and
   a first planar transistor including a first gate structure containing a second metal oxide layer pattern, a second metal pattern and a third metal pattern sequentially stacked, the second metal oxide layer pattern, the second metal pattern and the third metal pattern including materials substantially the same as those of the first metal oxide layer pattern, the first metal pattern and the metal line, respectively.

2. The semiconductor device of claim 1, wherein the first metal pattern includes a first metal having a work function for a gate electrode of an NMOS transistor and/or a second metal having a work function for a gate electrode of a PMOS transistor.

3. The semiconductor device of claim 2, wherein a portion of the first metal pattern directly contacting the first metal oxide layer pattern includes a metal that is substantially the same as that of the second metal pattern of the first gate structure.

4. The semiconductor device of claim 1, further comprising an adhesion layer pattern that is between the first metal pattern and the metal line, and that is between the second metal pattern and the third metal pattern.

5. The semiconductor device of claim 1, wherein each of the metal line and the third metal pattern includes an ohmic layer pattern, a barrier layer pattern and a metal layer pattern sequentially stacked.

6. The semiconductor device of claim 1, wherein the plurality of contact plugs include polysilicon.

7. The semiconductor device of claim 1, further comprising a first gate insulation layer pattern that includes silicon oxide and that is under the metal oxide layer pattern of the first gate structure.

8. The semiconductor device of claim 7, wherein the first gate insulation layer pattern has a thickness that is smaller than that of the insulation layer pattern in the first region of the substrate.

9. The semiconductor device of claim 1, further comprising a second planar transistor that is in the second region of the substrate,
wherein the second planar transistor includes a conductivity type that is different from that of the first planar transistor.

10. The semiconductor device of claim 9, wherein the second planar transistor includes a second gate structure containing a third metal oxide layer pattern, a lower metal pattern, a fourth metal pattern and a fifth metal pattern sequentially stacked, and the third metal oxide layer pattern, the fourth metal pattern and the fifth metal pattern include materials substantially the same as those of the first metal oxide layer pattern, the first metal pattern and the metal line, respectively.

11. The semiconductor device of claim 10, wherein the first metal pattern includes a metal having a work function for a gate electrode of an NMOS transistor, and the lower metal pattern includes a metal having a work function for a gate electrode of a PMOS transistor.

12. The semiconductor device of claim 10, further comprising a second gate insulation layer pattern under the third metal oxide layer pattern, the second gate insulation layer pattern including silicon oxide.

13. The semiconductor device of claim 1, further comprising a buried gate structure in the first region of the substrate.

14. The semiconductor device of claim 1, wherein a top surface of the first metal pattern is coplanar with or higher than a top surface of the contact plugs.

15. A semiconductor device, comprising:
a plurality of contact plugs contacting a substrate;
an insulation layer pattern between ones of the plurality of contact plugs, the insulation layer pattern having a top surface lower than top surfaces of the plurality of contact plugs relative to the substrate;
a metal oxide layer pattern on the insulation layer pattern, the metal oxide layer pattern having a dielectric constant higher than that of silicon oxide;
a metal pattern on the metal oxide layer pattern, the metal pattern contacting sidewalls of ones of the plurality of contact plugs; and
a metal line contacting top surfaces of ones of the plurality of contact plugs and the metal pattern and extending thereon.

16. A semiconductor device, comprising:
a plurality of contact plugs contacting a substrate;
a first metal oxide layer pattern between ones of the plurality of contacts, the first metal oxide layer pattern having a dielectric constant that is higher than that of silicon oxide;
a first metal pattern on the first metal oxide layer pattern;
a metal line on the first metal pattern;
a first planar transistor in a first region of the substrate, the first planar transistor including a first gate structure containing a second metal oxide layer pattern, a second metal pattern and a third metal pattern sequentially stacked, the second metal oxide layer pattern, the second metal pattern and the third metal pattern including materials substantially the same as those of the first metal oxide layer pattern, the first metal pattern and the metal line, respectively; and
a second planar transistor in a second region of the substrate, the second planar transistor includes a conductivity type that is different from that of the first planar transistor and including a second gate structure containing a third metal oxide layer pattern, a lower metal pattern, a fourth metal pattern and a fifth metal pattern sequentially stacked, and the third metal oxide layer pattern, the fourth metal pattern and the fifth metal pattern include materials substantially the same as those of the first metal oxide layer pattern, the first metal pattern and the metal line, respectively.

17. The semiconductor device of claim 16, wherein the first metal pattern includes a metal having a work function for a gate electrode of an NMOS transistor, and the lower metal pattern includes a metal having a work function for a gate electrode of a PMOS transistor.

18. The semiconductor device of claim 16, further comprising a second gate insulation layer pattern under the third metal oxide layer pattern, the second gate insulation layer pattern including silicon oxide.

19. The semiconductor device of claim 16, further comprising an insulation layer pattern between ones of the plurality of contact plugs, the insulation layer pattern having a top surface that is lower than top surfaces of the contact plugs.

20. The semiconductor device of claim 19,
wherein the first metal pattern contacts sidewalls of ones of the plurality of contact plugs, and
wherein the metal line contacts top surfaces of the contact plugs and the first metal pattern.

* * * * *